US012726174B2

(12) United States Patent
Torazawa et al.

(10) Patent No.: US 12,726,174 B2
(45) Date of Patent: Sep. 1, 2026

(54) ACOUSTIC WAVE DEVICE HAVING MASS LOADING STRIP WITH BUFFER LAYER

(71) Applicant: Skyworks Solutions, Inc., Irvine, CA (US)

(72) Inventors: Yumi Torazawa, Takatsuki (JP); Hironori Fukuhara, Ibaraki (JP); Yuji Yashiro, Kizugawa (JP); Kenta Morita, Amagasaki (JP)

(73) Assignee: Skyworks Solutions, Inc., Irvine, CA (US)

( * ) Notice: Subject to any disclaimer, the term of this patent is extended or adjusted under 35 U.S.C. 154(b) by 759 days.

(21) Appl. No.: 18/191,488

(22) Filed: Mar. 28, 2023

(65) Prior Publication Data

US 2023/0344407 A1 Oct. 26, 2023

Related U.S. Application Data

(60) Provisional application No. 63/325,369, filed on Mar. 30, 2022, provisional application No. 63/325,386, filed on Mar. 30, 2022, provisional application No. 63/325,353, filed on Mar. 30, 2022.

(51) Int. Cl.

| | |
|---|---|
| ***H03H 9/02*** | (2006.01) |
| ***H03H 3/10*** | (2006.01) |
| ***H03H 9/145*** | (2006.01) |
| ***H03H 9/25*** | (2006.01) |

(52) U.S. Cl.

CPC .......... *H03H 9/02889* (2013.01); *H03H 3/10* (2013.01); *H03H 9/02834* (2013.01); *H03H 9/02992* (2013.01); *H03H 9/145* (2013.01); *H03H 9/14502* (2013.01); *H03H 9/25* (2013.01)

(58) Field of Classification Search

CPC ........... H03H 9/02889; H03H 9/02834; H03H 9/02992

See application file for complete search history.

(56) References Cited

U.S. PATENT DOCUMENTS

| | | | |
|---|---|---|---|
| 6,426,583 | B1 | 7/2002 | Onishi et al. |
| 6,996,882 | B2 | 2/2006 | Onishi et al. |
| 7,898,360 | B2 | 3/2011 | Mitani et al. |
| 7,928,633 | B2 | 4/2011 | Iwasaki et al. |

(Continued)

*Primary Examiner* — Bryan P Gordon
(74) *Attorney, Agent, or Firm* — VIA LLP

(57) ABSTRACT

An acoustic wave device is disclosed. The acoustic wave device can include a piezoelectric layer, an interdigital transducer electrode formed with the piezoelectric layer, a temperature compensation layer over the interdigital transducer electrode. The interdigital transducer electrode includes a bus bar and fingers that extend from the bus bar. The fingers each includes an edge portion and a body portion. The acoustic wave device can include a mass loading strip overlaps the edge portions of the fingers. The acoustic wave device can include a portion of the temperature compensation layer is positioned between the mass loading strip and the piezoelectric layer. The acoustic wave device can include a buffer layer that is disposed at least partially between the mass loading strip and the temperature compensation layer. A thickness of the buffer layer can be at least one forth a thickness of the mass loading strip. The buffer layer can be disposed at least partially between a bottom side, a top side, and a side wall of the mass loading strip and the temperature compensation layer.

20 Claims, 24 Drawing Sheets

(56) References Cited

U.S. PATENT DOCUMENTS 7,982,365 B2 7/2011 Goto et al.
7,999,437 B2 8/2011 Kamiguchi et al.
8,154,171 B2 4/2012 Nishimura et al.
8,482,184 B2 7/2013 Goto et al.
8,508,101 B2 8/2013 Yamanouchi et al.
8,598,968 B2 12/2013 Seo et al.
8,878,362 B2 11/2014 Cheng
9,124,239 B2 9/2015 Nakayama et al.
9,257,962 B2 2/2016 Ikeuchi et al.
9,325,295 B2 4/2016 Nakayama et al.
9,422,621 B2 8/2016 Tiku et al.
9,443,803 B2 9/2016 Cheng
9,473,107 B2 10/2016 Komatsu et al.
9,553,049 B2 1/2017 Cheng
9,576,906 B2 2/2017 Cheng
9,735,249 B2 8/2017 Tiku et al.
10,374,574 B2 8/2019 Bulger
10,559,741 B2 2/2020 Bulger
10,911,020 B2 2/2021 Bulger
10,931,253 B2 2/2021 Ta et al.
11,082,029 B2 8/2021 Kodama et al.
11,165,411 B2 11/2021 Liu et al.
11,251,769 B2 2/2022 Takano et al.
11,349,454 B2 5/2022 Shin et al.
11,368,137 B2 6/2022 Goto et al.
11,387,808 B2 7/2022 Shin et al.
11,394,364 B2 7/2022 Matsuda et al.
11,424,732 B2 8/2022 Shin et al.
11,437,976 B2 9/2022 Kaneda et al.
11,463,069 B2 10/2022 Caron
11,496,111 B2 11/2022 Takano et al.
11,502,662 B2 11/2022 Ta et al.
11,552,614 B2 1/2023 Caron et al.
11,563,418 B2 1/2023 Caron
11,581,870 B2 2/2023 Takano et al.
11,606,078 B2 3/2023 Tang et al.
11,616,487 B2 3/2023 Nakamura et al.
11,616,491 B2 3/2023 Tang et al.
11,621,690 B2 4/2023 Fukuhara et al.
11,652,462 B2 5/2023 Ta et al.
11,689,178 B2 6/2023 Nakamura et al.
11,705,883 B2 7/2023 Hiramatsu et al.
11,705,886 B2 7/2023 Komatsu et al.
11,742,829 B2 8/2023 Komatsu et al.
11,791,793 B2 10/2023 Sun et al.
11,799,439 B2 10/2023 Ta et al.
11,799,445 B2 10/2023 Kodama et al.
11,799,447 B2 10/2023 Kaneda et al.
11,811,385 B2 11/2023 Takano et al.
11,848,658 B2 12/2023 Hiramatsu et al.
11,855,603 B2 12/2023 Matsuda et al.
11,876,501 B2 1/2024 Fukuhara et al.
11,881,837 B2 1/2024 Caron et al.
11,894,828 B2 2/2024 Nakamura et al.
11,909,377 B2 2/2024 Caron et al.
11,909,378 B2 2/2024 Caron et al.
11,923,822 B2 3/2024 Maki et al.
11,923,824 B2 3/2024 Caron
2011/0063047 A1 3/2011 Okuda
2013/0026881 A1 1/2013 Okamoto et al.
2017/0026026 A1 1/2017 Toyota
2017/0186694 A1 6/2017 Cheng
2020/0028479 A1 1/2020 Ta et al.
2020/0028493 A1 1/2020 Ta et al.
2020/0212876 A1* 7/2020 Goto .................. H03H 9/02228
2020/0259480 A1* 8/2020 Pensala .................... H03H 9/17
2020/0389150 A1* 12/2020 Wang ..................... H03H 9/174
2020/0389151 A1 12/2020 Goto
2021/0111688 A1 4/2021 Abbott et al.
2021/0111689 A1 4/2021 Abbott et al.
2021/0119607 A1 4/2021 Takano et al.
2021/0119608 A1 4/2021 Takano et al.
2021/0126616 A1* 4/2021 Hiramatsu ......... H03H 9/14541
2021/0135655 A1* 5/2021 Fukuhara ........... H03H 9/02834
2021/0152151 A1 5/2021 Takano et al.
2021/0159876 A1 5/2021 Maki et al.
2022/0014177 A1 1/2022 Liu et al.
2022/0158610 A1 5/2022 Goto et al.
2022/0158612 A1 5/2022 Goto et al.
2022/0209738 A1 6/2022 Torazawa et al.
2022/0244301 A1 8/2022 Xu et al.
2022/0286105 A1 9/2022 Goto et al.
2022/0321088 A1 10/2022 Goto et al.
2022/0321096 A1 10/2022 Goto et al.
2022/0329227 A1 10/2022 Goto et al.
2022/0368311 A1 11/2022 Shin et al.
2022/0399867 A1 12/2022 Goto et al.
2022/0399871 A1 12/2022 Goto et al.
2023/0008248 A1 1/2023 Komatsu et al.
2023/0009576 A1 1/2023 Komatsu et al.
2023/0010291 A1 1/2023 Komatsu et al.
2023/0013597 A1 1/2023 Goto et al.
2023/0031568 A1 2/2023 Tang et al.
2023/0083961 A1 3/2023 Komatsu et al.
2023/0095556 A1 3/2023 Komatsu et al.
2023/0096749 A1 3/2023 Komatsu et al.
2023/0110477 A1 4/2023 Maki et al.
2023/0111032 A1 4/2023 Goto et al.
2023/0111849 A1 4/2023 Maki et al.
2023/0113099 A1 4/2023 Goto et al.
2023/0113584 A1 4/2023 Chang et al.
2023/0163746 A1 5/2023 Caron et al.
2023/0208385 A1 6/2023 Hiramatsu et al.
2023/0208396 A1 6/2023 Hiramatsu et al.
2023/0208398 A1 6/2023 Goto et al.
2023/0208399 A1 6/2023 Goto et al.
2023/0223919 A1 7/2023 Goto et al.
2023/0223930 A1 7/2023 Ikeuchi
2023/0223963 A1 7/2023 Ikeuchi
2023/0225212 A1 7/2023 Goto et al.
2023/0275565 A1 8/2023 Tang et al.
2023/0283254 A1 9/2023 Ta et al.
2023/0283255 A1 9/2023 Nakamura et al.
2023/0291385 A1 9/2023 Okamoto et al.
2023/0308081 A1 9/2023 Tang et al.
2023/0318566 A1 10/2023 Yasuda et al.
2023/0327635 A1 10/2023 Hill et al.
2023/0336145 A1 10/2023 Goto et al.
2023/0336146 A1 10/2023 Feld et al.
2023/0336147 A1 10/2023 Feld et al.
2023/0336152 A1 10/2023 Goto et al.
2023/0336153 A1 10/2023 Goto et al.
2023/0344403 A1 10/2023 Goto et al.
2023/0344406 A1 10/2023 Torazawa et al.
2023/0344408 A1 10/2023 Torazawa et al.
2023/0344410 A1 10/2023 Goto et al.
2023/0344411 A1 10/2023 Chen et al.
2023/0344415 A1 10/2023 Chen et al.
2023/0344416 A1 10/2023 Chen et al.
2023/0353119 A1 11/2023 Hill et al.
2023/0361753 A1 11/2023 Yasuda et al.
2023/0387887 A1 11/2023 Komatsu et al.
2023/0403939 A1 12/2023 Goto et al.
2024/0007079 A1 1/2024 Goto et al.
2024/0048125 A1 2/2024 Goto et al.
2024/0063770 A1 2/2024 Sun et al.
2024/0072758 A1 2/2024 Takano et al.
2024/0088862 A1 3/2024 Ta et al.
2024/0088865 A1 3/2024 Matsuda et al.
2024/0088867 A1 3/2024 Kaneda et al.
2024/0258994 A1 8/2024 Steiner et al.

* cited by examiner 1
10
12
14
14a
14b
16
16a
16b
16c
16d
17
18
21
22
22a
22b
22c
24
25
26
27
28
$t_1$
$t_2$
$t_3$
$t_4$
$t_5$
$W_1$
$W_2$
1A 1'
t1
t2
t3
t4
d
10
12
14
14a
14b
16
16a
16b
16c
16d
17
18
21
22
22a
22b
22c
24
25
26
27
28
1C 2
21
26
12′
10
3A, 3B
14
16
17
18
22′
24′
$t_1$
$t_2$
$W_1$
$W_2$
2A
2A

12′
10

12′
10
114a

12′
10
116
114a 16
12′
10
114a 14
12′
10
21
16a
16
16c
16d
17
16b
114b
114a 14
12′
10
16
17′
114b
114a
21
16a
16c
16d
16b t
$t_2$
$t_3$
3
21a
21b
21c
21′
14
16
16a
16b
17
18
28
26
10
12
22
24
6A

3′
23
21″
17
18
14
22′
24′
26
12′
10
$t_1$
$t_2$
$W_1$
$W_2$
16
17
24
22′
24′
6C
6C $t_1$
$t_2$
$t_3$
4
10
12
14
16
17
22
24
26
28
7A 5
10
12
14
16′
17
18
20
21
22
24
26
28
8A
$t_1$
$t_2$
$t_3$
$t_6$ 24
11A
14
22b''
16'b
16'
17
16'a
16'
22''
22c''
22a''
10
8
11A
12''

9
10
12'''
12A
12A
14
16'
16'
16'a
16'b
17
22'''
22a'''
22b'''
22c'''
24
40

24″
13A
14
42
22b″
17
16′
22″

22c″
22a″
10
11
13A
12″″

14A
14A
24'''
22b''''
17
16'
16'
22''''
22c''''
44
22a''''
11'
14
10
12'''''

ACOUSTIC WAVE DEVICE HAVING MASS LOADING STRIP WITH BUFFER LAYER

INCORPORATION BY REFERENCE TO ANY PRIORITY APPLICATIONS

Any and all applications for which a foreign or domestic priority claim is identified in the Application Data Sheet as filed with the present application, including U.S. Provisional Patent Application No. 63/325,353, filed Mar. 30, 2022, titled "ACOUSTIC WAVE DEVICE HAVING MASS LOADING STRIP WITH BUFFER LAYER," U.S. Provisional Patent Application No. 63/325,386, filed Mar. 30, 2022, titled "TEMPERATURE COMPENSATED SURFACE ACOUSTIC WAVE DEVICE HAVING MASS LOADING STRIP WITH BUFFER LAYER," and U.S. Provisional Patent Application No. 63/325,369, filed Mar. 30, 2022, titled "ACOUSTIC WAVE DEVICE HAVING MASS LOADING STRIP WITH THERMAL EXPANSION COMPENSATION BUFFER LAYER," are hereby incorporated by reference under 37 CFR 1.57 in their entirety.

BACKGROUND

Technical Field

Embodiments of this disclosure relate to acoustic wave devices with a mass loading strip for transverse mode suppression.

Description of Related Technology

Piezoelectric microelectromechanical systems (MEMS) resonators can be used in radio frequency systems. Piezoelectric MEMS resonators can process electrical signals using mechanically vibrating structures. Example piezoelectric MEMS resonators include surface acoustic (SAW) resonators and temperature compensated surface acoustic wave (TC-SAW) resonators.

Acoustic wave filters can include TCSAW resonators. Acoustic wave filters can filter radio frequency signals in radio frequency electronic systems. For instance, filters in a radio frequency front end of a mobile phone can include acoustic wave filters. Multiple acoustic wave filters can be arranged as a multiplexer, such as a duplexer.

SUMMARY

The innovations described in the claims each have several aspects, no single one of which is solely responsible for its desirable attributes. Without limiting the scope of the claims, some prominent features of this disclosure will now be briefly described.

In one aspect, an acoustic wave device is disclosed. The acoustic wave device can include a piezoelectric layer and an interdigital transducer electrode formed with the piezoelectric layer. The interdigital transducer electrode includes a bus bar and fingers extending from the bus bar. The fingers each including an edge portion and a body portion. The acoustic wave device can include a temperature compensation layer over the interdigital transducer electrode, and a mass loading strip overlapping the edge portions of the fingers. A portion of the temperature compensation layer is positioned between the mass loading strip and the piezoelectric layer. The acoustic wave device can include a buffer layer disposed at least partially between the mass loading strip and the temperature compensation layer. A thickness of the buffer layer is at least one forth a thickness of the mass loading strip.

In one embodiment, the mass loading strip includes a layer having a density that is at least as high as a most dense layer of a material of the interdigital transducer electrode. The mass loading strip can consist of the layer. The mass loading strip can include a second layer.

In one embodiment, the mass loading strip is embedded in the temperature compensation layer.

In one embodiment, the temperature compensation layer is a silicon dioxide layer. The mass loading strip can be a molybdenum layer. The buffer layer can be a molybdenum silicide layer.

In one embodiment, the buffer layer includes a material different from materials of the temperature compensation layer and the mass loading strip.

In one embodiment, the buffer layer has a coefficient of thermal expansion greater than a coefficient of thermal expansion of the temperature compensation layer and less than a coefficient of thermal expansion of the mass loading strip.

In one embodiment, the mass loading strip has a bottom side, an top side, and a sidewall extending between the bottom side and the top side. The buffer layer can be disposed between the top side and the sidewall of the mass loading strip and the temperature compensation layer. The buffer layer can be further disposed between the bottom side of the mass loading strip and the temperature compensation layer.

In one embodiment, the thickness of the buffer layer is at least one third the thickness of the mass loading strip.

In one embodiment, the acoustic wave device further includes a silicon nitride layer over the temperature compensation layer.

In one aspect, an acoustic wave device is disclosed. The acoustic wave device can include a piezoelectric layer, and an interdigital transducer electrode formed with the piezoelectric layer. The interdigital transducer electrode includes a bus bar and fingers extending from the bus bar. The fingers each includes an edge portion and a body portion. The acoustic wave device can include a temperature compensation layer over the interdigital transducer electrode, and a mass loading strip overlapping the edge portions of the fingers. A portion of the temperature compensation layer is positioned between the mass loading strip and the piezoelectric layer. The mass loading strip has a bottom side, an top side, and a sidewall extending between the bottom side and the top side. The acoustic wave device can include a buffer layer disposed at least partially between the bottom side, the top side, and the side wall of the mass loading strip and the temperature compensation layer.

In one embodiment, the mass loading strip includes a layer having a density that is at least as high as a most dense layer of a material of the interdigital transducer electrode. The mass loading strip can consist of the layer. The mass loading strip can include a second layer.

In one embodiment, the mass loading strip is embedded in the temperature compensation layer.

In one embodiment, the temperature compensation layer is a silicon dioxide layer. The mass loading strip can be a molybdenum layer. The buffer layer can be a molybdenum silicide layer.

In one embodiment, the buffer layer includes a material different from materials of the temperature compensation layer and the mass loading strip.

In one embodiment, the buffer layer has a coefficient of thermal expansion greater than a coefficient of thermal expansion of the temperature compensation layer and less than a coefficient of thermal expansion of the mass loading strip.

In one embodiment, the thickness of the buffer layer is at least one third the thickness of the mass loading strip.

In one embodiment, the acoustic wave device further includes a silicon nitride layer over the temperature compensation layer.

In one aspect, an acoustic wave device is disclosed. The acoustic wave device can include a piezoelectric layer, and an interdigital transducer electrode formed with the piezoelectric layer. The interdigital transducer electrode includes a bus bar and fingers extending from the bus bar. The fingers each including an edge portion and a body portion. The acoustic wave device can include a temperature compensation layer over the interdigital transducer electrode, and a mass loading strip overlapping the edge portions of the fingers. A portion of the temperature compensation layer is positioned between the mass loading strip and the piezoelectric layer. The acoustic wave device can include a buffer layer disposed at least partially between the mass loading strip and the temperature compensation layer. The buffer layer includes a material different from materials of the temperature compensation layer and the mass loading strip.

In one embodiment, the mass loading strip includes a layer having a density that is at least as high as a most dense layer of a material of the interdigital transducer electrode. The mass loading strip can consist of the layer. The mass loading strip can include a second layer.

In one embodiment, the mass loading strip is embedded in the temperature compensation layer.

In one embodiment, the temperature compensation layer is a silicon dioxide layer. The mass loading strip can be a molybdenum layer.

In one embodiment, a thickness of the buffer layer is at least one forth a thickness of the mass loading strip.

In one embodiment, the buffer layer has a coefficient of thermal expansion greater than a coefficient of thermal expansion of the temperature compensation layer and less than a coefficient of thermal expansion of the mass loading strip.

In one embodiment, the mass loading strip has a bottom side, an top side, and a sidewall extending between the bottom side and the top side. The buffer layer can be disposed between the top side and the sidewall of the mass loading strip and the temperature compensation layer. The buffer layer can be further disposed between the bottom side of the mass loading strip and the temperature compensation layer.

In one embodiment, a difference between the coefficient of thermal expansion of the temperature compensation layer and the coefficient of thermal expansion of the metal strip is ΔCTE. The coefficient of thermal expansion of the buffer layer can be 0.2ΔCTE to 0.75ΔCTE greater than the coefficient of thermal expansion of the temperature compensation layer. The coefficient of thermal expansion of the buffer layer can be 0.3ΔCTE to 0.75ΔCTE greater than the coefficient of thermal expansion of the temperature compensation layer.

In one embodiment, the acoustic wave device further includes a silicon nitride layer over the temperature compensation layer.

In one aspect, a method of forming an acoustic wave device is disclosed. The method can include forming an interdigital transducer electrode formed with a piezoelectric layer. The interdigital transducer electrode including a bus bar and fingers extending from the bus bar. The fingers each includes an edge portion and a body portion. The method can include forming a temperature compensation layer over the interdigital transducer electrode. The method can include forming a mass loading strip overlapping the edge portions of the fingers. A portion of the temperature compensation layer is positioned between the mass loading strip and the piezoelectric layer. The method can include forming a buffer layer disposed at least partially between the mass loading strip and the temperature compensation layer. The forming the buffer layer includes depositing the mass loading strip.

In one embodiment, the mass loading strip includes a layer having a density that is at least as high as a most dense layer of a material of the interdigital transducer electrode. The mass loading strip can consist of the layer. The mass loading strip can include a second layer.

In one embodiment, the mass loading strip is embedded in the temperature compensation layer.

In one embodiment, the temperature compensation layer is a silicon dioxide layer. The mass loading strip can be a molybdenum layer.

In one embodiment, the buffer layer includes a material different from materials of the temperature compensation layer and the mass loading strip.

In one embodiment, a thickness of the buffer layer is at least one forth a thickness of the mass loading strip.

In one embodiment, the buffer layer includes a material different from materials of the temperature compensation layer and the mass loading strip.

In one embodiment, the buffer layer has a coefficient of thermal expansion greater than a coefficient of thermal expansion of the temperature compensation layer and less than a coefficient of thermal expansion of the mass loading strip.

In one embodiment, the mass loading strip has a bottom side, an top side, and a sidewall extending between the bottom side and the top side. The buffer layer can be disposed between the top side and the sidewall of the mass loading strip and the temperature compensation layer. The buffer layer can be further disposed between the bottom side of the mass loading strip and the temperature compensation layer.

In one embodiment, a difference between the coefficient of thermal expansion of the temperature compensation layer and the coefficient of thermal expansion of the metal strip is ΔCTE. The coefficient of thermal expansion of the buffer layer can be 0.2ΔCTE to 0.75ΔCTE greater than the coefficient of thermal expansion of the temperature compensation layer. The coefficient of thermal expansion of the buffer layer can be 0.3ΔCTE to 0.75ΔCTE greater than the coefficient of thermal expansion of the temperature compensation layer.

In one embodiment, the method further includes forming a silicon nitride layer over the temperature compensation layer.

In one embodiment, the forming the buffer layer includes reacting the mass loading strip and the temperature compensation layer. The forming the temperature compensation layer can include sputtering the temperature compensation layer at a sputtering temperature in a range between 200° C. and 300° C.

In one aspect, an acoustic wave device is disclosed. The acoustic wave device can include a piezoelectric layer, and an interdigital transducer electrode formed with the piezoelectric layer. The interdigital transducer electrode includes a bus bar and fingers extending from the bus bar. The fingers each includes an edge portion and a body portion. The acoustic wave device can include a temperature compensation layer over the interdigital transducer electrode, and a mass loading strip overlapping the edge portions of the fingers. A portion of the temperature compensation layer is positioned between the mass loading strip and the piezoelectric layer. The acoustic wave device can include a buffer layer disposed at least partially between the mass loading strip and the temperature compensation layer. The buffer layer having a coefficient of thermal expansion greater than a coefficient of thermal expansion of the temperature compensation layer and less than a coefficient of thermal expansion of the mass loading strip.

In one embodiment, the mass loading strip includes a layer having a density that is at least as high as a most dense layer of a material of the interdigital transducer electrode. The mass loading strip can consist of the layer. The mass loading strip can include a second layer.

In one embodiment, the mass loading strip is embedded in the temperature compensation layer.

In one embodiment, the temperature compensation layer is a silicon dioxide layer. The mass loading strip can be a molybdenum layer. The buffer layer can be a molybdenum silicide layer.

In one embodiment, the buffer layer includes a material different from materials of the temperature compensation layer and the mass loading strip.

In one embodiment, a thickness of the buffer layer is at least one forth a thickness of the mass loading strip. The thickness of the buffer layer can be at least one third the thickness of the mass loading strip.

In one embodiment, the mass loading strip has a bottom side, an top side, and a sidewall extending between the bottom side and the top side. The buffer layer is disposed between the top side and the sidewall of the mass loading strip and the temperature compensation layer. The buffer layer can be further disposed between the bottom side of the mass loading strip and the temperature compensation layer.

In one embodiment, a difference between the coefficient of thermal expansion of the temperature compensation layer and the coefficient of thermal expansion of the metal strip is ΔCTE. The coefficient of thermal expansion of the buffer layer can be 0.2ΔCTE to 0.75ΔCTE greater than the coefficient of thermal expansion of the temperature compensation layer. The coefficient of thermal expansion of the buffer layer can be 0.3ΔCTE to 0.75ΔCTE greater than the coefficient of thermal expansion of the temperature compensation layer. The coefficient of thermal expansion of the buffer layer can be 0.4ΔCTE to 0.75ΔCTE greater than the coefficient of thermal expansion of the temperature compensation layer.

In one embodiment, the acoustic wave device further includes a silicon nitride layer over the temperature compensation layer.

In one aspect, an acoustic wave device is disclosed. The acoustic wave device can include a piezoelectric layer, and an interdigital transducer electrode formed with the piezoelectric layer. The interdigital transducer electrode including a bus bar and fingers extending from the bus bar. The fingers each includes an edge portion and a body portion. The acoustic wave device can include a temperature compensation layer over the interdigital transducer electrode, and a mass loading strip overlapping the edge portions of the fingers. A portion of the temperature compensation layer is positioned between the mass loading strip and the piezoelectric layer. The mass loading strip includes a layer having a density that is at least as high as a most dense layer of a material of the interdigital transducer electrode. The acoustic wave device can include a buffer layer disposed at least partially between the mass loading strip and the temperature compensation layer. A difference between a coefficient of thermal expansion of the temperature compensation layer and a coefficient of thermal expansion of the metal strip is ΔCTE. A coefficient of thermal expansion of the buffer layer is 0.2ΔCTE to 0.75ΔCTE greater than the coefficient of thermal expansion of the temperature compensation layer.

In one embodiment, the coefficient of thermal expansion of the buffer layer is 0.3ΔCTE to 0.75ΔCTE greater than the coefficient of thermal expansion of the temperature compensation layer.

In one embodiment, a thickness of the buffer layer is at least one forth a thickness of the mass loading strip.

The present disclosure relates to U.S. patent application Ser. No. 18/191,497, titled "TEMPERATURE COMPENSATED SURFACE ACOUSTIC WAVE DEVICE HAVING MASS LOADING STRIP WITH BUFFER LAYER," filed on Mar. 28, 2023, and U.S. Patent application Ser. No. 18/191,514, titled "ACOUSTIC WAVE DEVICE HAVING MASS LOADING STRIP WITH THERMAL EXPANSION COMPENSATION BUFFER LAYER," filed on Mar. 28, 2023, the entire disclosures of which are hereby incorporated by reference herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figures 1A, 1B:
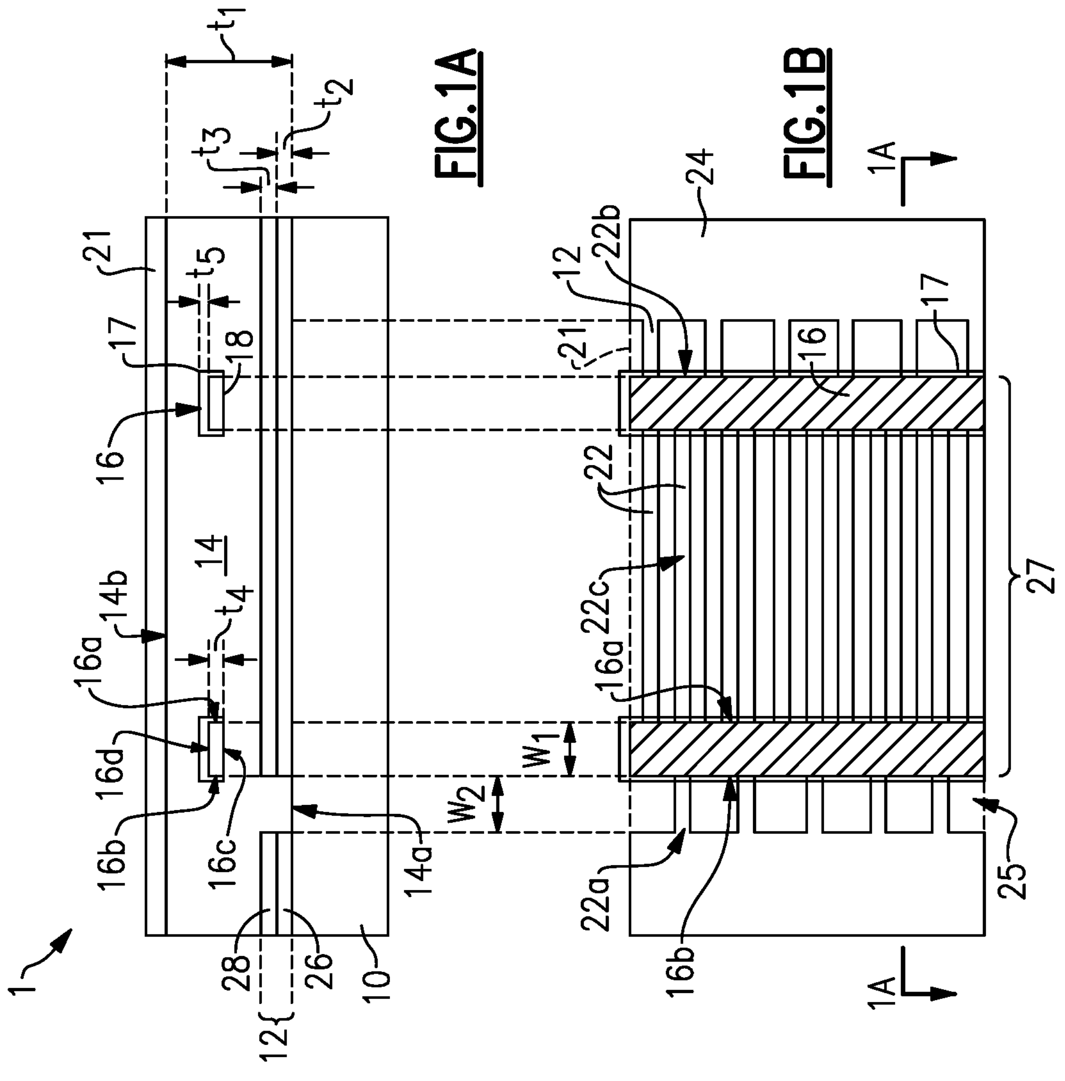
FIG. 1A illustrates a schematic cross-sectional side view of a surface acoustic wave (SAW) resonator according to an embodiment.
FIG. 1B illustrates a top view of the SAW resonator of FIG. 1A.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. The SAW devices include SAW resonators, SAW delay lines, and multi-mode SAW (MMS) filters (e.g., double mode SAW (DMS) filters).

In general, high quality factor (Q), large effective electromechanical coupling coefficient ($k^2_{eff}$), high frequency ability, and spurious free can be significant aspects for micro resonators to enable low-loss filters, stable oscillators, and sensitive sensors. SAW resonators can have a relatively strong transverse mode in and/or near a pass band. The presence of the relatively strong transverse modes can hinder the accuracy and/or stability of oscillators and sensors, as well as hurt the performance of acoustic wave filters by creating relatively severe passband ripples and possibly limiting the rejection.

Therefore, transverse mode suppression is significant for SAW resonators. A technical solution for suppressing transverse modes is to create a border region with a different frequency from active region according to the mode dispersion characteristic. This can be referred to as a "piston mode." A piston mode can be obtained to cancel out the transverse wave vector in a lateral direction without significantly degrading the $k^2$ or Q. By including a relatively small border region with a slower velocity on the edge of the acoustic aperture of a SAW resonator, a propagating mode can have a zero (or approximately zero) transverse wave vector in the active aperture.

One way of achieving a piston mode is to include a material that can cause a magnitude of the velocity in the underlying region of the SAW resonator to be increased. The material can be, for example, silicon nitride (SiN). As an example, SiN can be positioned over a center region of an interdigital transducer electrode (IDT) and the border region of the IDT electrode can be free from the SiN.

A relatively high density IDT electrode, such as tungsten (W) IDT electrode, can be used for downsizing by slowing down the SAW propagation velocity of a temperature-compensated SAW (TCSAW) resonator. Transverse mode suppression can be significant for TCSAW device performance. However, a TCSAW resonator with an IDT electrode that includes tungsten can encounter difficulty in suppressing transverse modes. For instance, a silicon nitride layer with a trench over a temperature compensation layer for a piston mode may not sufficiently suppress transverse modes in such resonators. This can be due to resonator displacement being distributed deep inside a silicon dioxide ($SiO_2$) temperature compensation layer of the TCSAW resonator.

Another way to achieve piston mode is to provide a mass loading strip (e.g., a conductive strip) on edges of an IDT electrode active regions of the SAW resonator. The transverse wave vector can be real in the border region and imaginary on a gap region. A piston mode SAW resonator can have even order modes that have a multiple of full wave lengths in the active region, which should not significantly couple to electrical domain.

An IDT electrode with a tungsten layer has a relatively high density. Acoustic energy can be gathered into the IDT side. In such a case, the perturbation on a surface of a silicon dioxide temperature compensation layer over the IDT electrode can be ineffective. A conductive strip that includes a tungsten layer buried in the silicon dioxide temperature compensation layer can effectively control the velocity of a TCSAW resonator with an IDT electrode that includes tungsten. The combination of the conductive strip material and the IDT electrode material can be significant. For example, a conductive strip with a molybdenum layer may not sufficiently suppress transverse modes in a TCSAW resonator with an IDT electrode that includes tungsten. The conductive strip can include a layer having a density that is at least as high as a density of a most dense layer of the IDT electrode. The conductive strip can include a layer having a density that is at least as high as a density of a material of the IDT electrode that is in contact with a piezoelectric layer of the TCSAW resonator.

Formation of the mass loading trip may cause a void in the temperature compensation layer. A relatively large void in the temperature compensation layer can negatively affect the suppression of transverse modes in the TCSAW resonator. Various embodiments disclosed herein can prevent or mitigate formation of a void, or minimize the size of the void in the TCSAW resonator that include a mass loading strip.

Aspects of this disclosure relate to SAW resonators (e.g., TCSAW resonators) that include mass loading structure (e.g., a metal strip) that includes a relatively high density metal layer. The metal strip can be buried in a temperature compensation layer, such as a silicon dioxide layer. The high density layer has a density at least as high as a density of a material of an IDT electrode that is in contact with piezoelectric layer. The SAW resonators can have a buffer layer that prevents or mitigate formation of a void, or reduce or minimize a size of the void. The buffer layer can be disposed at least partially between the mass loading structure and a temperature compensation layer. The buffer layer has a coefficient of thermal expansion (CTE) greater than a CTE of the temperature compensation layer and less than a CTE of the mass loading structure.

Although embodiments may be discussed with reference to metal strips or conductive strips, any suitable principles and advantages disclosed herein can be applied to a mass loading strip that includes one or more non-conductive layers. Moreover, although embodiments may be discussed with reference to SAW resonators, the principles and advantages discussed herein can be applied to any suitable SAW device and/or any other suitable acoustic wave device. Embodiments will now be discussed with reference to drawings. Any suitable combination of features of the embodiments disclosed herein can be implemented together with each other.

FIG. 1A illustrates a schematic cross-sectional side view of a surface acoustic wave (SAW) resonator 1 according to an embodiment. The SAW resonator 1 includes a piezoelectric layer 10, an IDT electrode 12 formed with (e.g., disposed at least partially within, disposed over, or embedded in) the piezoelectric layer 10, a temperature compensation layer 14 over the IDT electrode 12, a mass loading strip (e.g., a metal strip 16) at least partially buried in the temperature compensation layer 14, a buffer layer 17 that is disposed at least partially between the mass loading strip and the temperature compensation layer 14, and a dispersion adjustment layer 21 over the temperature compensation layer 14. The mass loading strip can be completely buried in the temperature compensation layer 14 in some embodiments. The dispersion adjustment layer 21 can serve as a passivation layer and/or a trimming layer for frequency trimming. The metal strip 16 has sidewalls (an inner sidewall 16*a* and an outer sidewall 16*b*) that extend between a bottom side 16*c* and a top side 16*d* of the metal strip 16.

The illustrated metal strip 16 includes a high density metal strip layer 18. The metal strip 16 can be a multi-layer conductive strip in certain embodiments (see, for example, FIGS. 8A-14B, 16A, and 16B). The metal strip 16 can implement piston mode. The illustrated metal strip 16 is floating. However, in some embodiments, the metal strip 16 can be grounded.

The metal strip 16 performs a mass loading function. Accordingly, the metal strip 16 is an example of a mass loading strip. In certain applications, a mass loading strip of any suitable non-metal and/or non-conductive material that has a density that is equal to or greater than a density of a most dense layer of the IDT electrode 12 can be implemented in place of the metal strip 16 and/or any metal strip disclosed herein. Such a non-conductive layer can include a heavy dielectric layer such as tantalum pentoxide (Ta2O5), tellurium dioxide (TeO2), or a like dielectric material.

The piezoelectric layer 10 can include any suitable piezoelectric material, such as a lithium niobate (LN) layer or a lithium tantalate (LT) layer. A thickness of the piezoelectric layer 10 can be selected based at least in part on a wavelength λ or L of a surface acoustic wave generated by the surface acoustic wave resonator 1 in certain applications. The IDT electrode 12 has a pitch that sets the wavelength λ or L of the surface acoustic wave resonator 1. The piezoelectric layer 10 can be sufficiently thick to avoid significant frequency variation.

The illustrated IDT electrode 12 includes a first layer 26 and a second layer 28. The IDT electrode 12 includes fingers 22 and bus bars 24, which are illustrated in FIG. 1B. In the surface acoustic wave resonator 1, the IDT electrode 12 includes separate IDT layers that impact acoustic properties and electrical properties, respectively. Accordingly, electrical properties, such as insertion loss, can be improved by adjusting one of the IDT layers without significantly impacting acoustic properties. In some embodiments, the IDT electrode 12 can be at least partially disposed within the piezoelectric layer 10. For example, the IDT electrode can be completely embedded in, partially disposed in, or disposed on the piezoelectric layer 10.

The first layer 26 of the IDT electrode 12 can be referred to as a lower electrode layer. The first layer 26 of the IDT electrode 12 is disposed between the second layer 28 of the IDT electrode 12 and the piezoelectric layer 10. As illustrated, the first layer 26 of the IDT electrode 12 has a first side in physical contact with the piezoelectric layer 10 and a second side in physical contact with the second layer 28 of the IDT electrode 12. The first layer 26 can impact acoustic properties of the SAW resonator 1. For instance, a thickness t2 of the first layer 26 of the IDT electrode 12 can impact resonant frequency of the SAW resonator 1.

The second layer 28 of the IDT electrode 12 can be referred to as an upper electrode layer. The second layer 28 of the IDT electrode 12 is disposed between the first layer 26 of the IDT electrode 12 and the temperature compensation layer 14. As illustrated, the second layer 28 of the IDT electrode 12 has a first side in physical contact with the first layer 26 of the IDT electrode 12 and a second side in physical contact with the temperature compensation layer 14. The second layer 28 of the IDT electrode 12 can impact electrical properties of the SAW resonator 1. A thickness t3 of the second layer 28 of the IDT electrode 12 can impact insertion loss of the SAW resonator 1. The thickness t3 of the second layer 28 of the IDT electrode 12 may not significantly impact acoustic properties of the SAW resonator 1.

The IDT electrode 12 can include any suitable material. For example, the first layer 26 can be tungsten (W) and the second layer 28 can be aluminum (Al) in certain embodiments. The IDT electrode 12 may include one or more other metals, such as copper (Cu), Magnesium (Mg), titanium (Ti), molybdenum (Mo), etc. The IDT electrode 12 may include alloys, such as AlMgCu, AlCu, etc.

Although some embodiments disclosed herein include IDT electrodes with two IDT layers, any suitable principles and advantages disclosed herein can be applied to single layer IDT electrodes or multi-layer IDT electrodes that include three or more IDT layers.

The temperature compensation layer 14 can include any suitable temperature compensation material. For example, the temperature compensation layer 14 can be a silicon dioxide ($SiO_2$) layer. The temperature compensation layer 14 can be a layer of any other suitable material having a positive temperature coefficient of frequency for SAW resonators with a piezoelectric layer having a negative coefficient of frequency. For instance, the temperature compensation layer 14 can be a tellurium dioxide ($TeO_2$) layer or a silicon oxyfluoride (SiOF) layer in certain applications. In some other embodiments, the temperature compensation layer 14 can include any suitable combination of $SiO_2$, $TeO_2$, and/or SiOF.

The temperature compensation layer 14 can bring the temperature coefficient of frequency (TCF) of the SAW resonator 1 closer to zero relative to a similar SAW resonator without the temperature compensation layer 14. The temperature compensation layer 14 together with a lithium niobate piezoelectric layer can improve the electromechanical coupling coefficient ($k^2$) of the SAW resonator 1 relative to a similar SAW resonator with a lithium tantalate piezoelectric layer and without the temperature compensation layer 14. This advantage of the temperature compensation layer 14 can be more pronounced when the SAW resonator 1 includes an LN layer as the piezoelectric layer 10.

The buffer layer 17 can be disposed at least partially between the mass loading strip and the temperature compensation layer 14. In some embodiments, as shown in FIG. 1A, the buffer layer 17 can be disposed between the inner sidewall 16*a*, an outer sidewall 16*b*, and a top side 16*d* of the metal strip 16 and portions of the temperature compensation layer 14. For example, the buffer layer 17 can be disposed conformally over the metal strip 16. In some other embodiments, the buffer layer 17 can also be disposed between the bottom side 16*c* of the metal strip 16 and a portion of the temperature compensation layer 14.

The buffer layer 17 can include any suitable material. The buffer layer 17 has a coefficient of thermal expansion (CTE) greater than a CTE of the temperature compensation layer 14 and less than a CTE of the mass loading strip (e.g., the metal strip 16). In some embodiments, where a difference between the CTE of the temperature compensation layer 14 and the CTE of the metal strip 16 is ΔCTE, the buffer layer 17 can have a CTE that is 0.2ΔCTE to 0.75ΔCTE greater than the CTE of the temperature compensation layer 14. For example, the buffer layer 17 can have a CTE that is 0.25ΔCTE to 0.75ΔCTE, 0.3ΔCTE to 0.75ΔCTE, 0.4ΔCTE to 0.75ΔCTE, 0.5ΔCTE to 0.75ΔCTE, 0.2ΔCTE to 0.7ΔCTE, 0.2ΔCTE to 0.6ΔCTE, 0.25ΔCTE to 0.7ΔCTE, 0.3ΔCTE to 0.7ΔCTE greater than the CTE of the temperature compensation layer 14. Selecting a material of the buffer layer 17 having a CTE from these ranges can be critical in preventing or mitigating formation of a void, and/or minimizing a size of the void formed due to, for example, delamination of the metal strip 16 from the temperature compensation layer 14 in the TCSAW resonator 1.

In some embodiments in which the temperature compensation layer 14 is a silicon dioxide ($SiO_2$) layer, and the metal strip 16 is a molybdenum (Mo) layer, the buffer layer 17 can include a material having a mixture of Mo, Si, and O (e.g., a molybdenum silicide). For example, the buffer layer 17 can have an average molybdenum content of about 10% to 20%, an average silicon content of about 25% to 35%, and average oxide content of about 50% to 60%.

In some embodiments, the buffer layer 17 can be formed by applying heat. For example, during formation of the temperature compensation layer 14 by way of, for example, sputtering, heat can be applied. A sputtering temperature for the sputtering process can be, for example, in a range between 200° C. and 300° C. In such embodiments, material of the temperature compensation layer 14 and a material of the meatal strip 16 can react to form the buffer layer 17. The material and a thickness of the buffer layer 17 can depend at least in part on the temperature and duration of the sputtering process. In some embodiments, the heat can be applied after forming the temperature compensation layer 14. For example, the temperature compensation layer 14 and the metal strip 16 can be annealed at a temperature in a range between 300° C. to 350° C. The material and a thickness of the buffer layer 17 can depend at least in part on the temperature and duration of the annealing process. The following table (Table 1) shows an example composition of the temperature compensation layer 14, the metal strip 16, and the buffer layer 18 formed during a temperature compensation layer forming process, according to an embodiment.

TABLE 1

| | Element | Average % |
|---|---|---|
| Buffer layer (Top) | Oxide | 54.7 |
| | Silicon | 29.4 |
| | Molybdenum | 15.9 |
| Buffer layer (side) | Oxide | 55.9 |
| | Silicon | 29.6 |
| | Molybdenum | 14.5 |
| Molybdenum metal strip | Oxide | 16.4 |
| | Silicon | 2.2 |
| | Molybdenum | 81.4 |
| Silicon dioxide temperature compensation layer | Oxide | 56.3 |
| | Silicon | 43.6 |
| | Molybdenum | 0.1 |

In some embodiments, the buffer layer 17 can include material that is not included in the temperature compensation layer 14 and the metal strip 16. For example, a material that has a CTE greater than a CTE of the temperature compensation layer 14 and less than a CTE of the mass loading strip (e.g., the metal strip 16) can be disposed between the temperature compensation layer 14 and the metal strip 16 by way of deposition. In some embodiments, where a difference between the CTE of the temperature compensation layer 14 and the CTE of the metal strip 16 is ΔCTE, the material of the buffer layer 17 can have a CTE that is 0.2ΔCTE to 0.75ΔCTE greater than the CTE of the temperature compensation layer 14.

The buffer layer 17 can improve adhesion between the metal strip 16 and the temperature compensation layer 14. The buffer layer 17 can prevent, mitigate, or suppress formation of a void between the metal strip 16 and the temperature compensation layer 14. Accordingly, the buffer layer 17 can enable effective transverse mode suppression by the metal strip 16.

In the illustrated SAW resonator 1 of FIG. 1A, the dispersion adjustment layer 21 is a SiN layer disposed entirely over an upper surface 14*b* of the temperature compensation layer 14. However, the dispersion adjustment layer 21 (e.g., a SiN layer) may be partially disposed over the upper surface 14*b* of the temperature compensation layer 14. In some instances, the IDT electrode 12 can include fingers having the SiN layer over an active region and border regions free from SiN as shown in other embodiments disclosed herein. The SiN layer can cause a magnitude of the velocity in the underlying region of the SAW resonator 1 to be increased. In certain applications, the dispersion adjustment layer 21 can include another suitable material, such as a silicon oxynitride (SiON) layer, in place of or in combination with the illustrated SiN layer to increase the magnitude of the velocity of the underlying region of the SAW resonator 1. According to some applications, the dispersion adjustment layer 21 can include SiN and another material. The dispersion adjustment layer 21 can also function as a passivation layer.

FIG. 1B illustrates a top plan view of the IDT electrode 12, the metal strip 16, and the buffer layer 17 of the SAW resonator 1 of FIG. 1A. The dashed lines between FIGS. 1A and 1B show relative positions of the illustrated components. The illustrated SAW resonator 1 of FIGS. 1A and 1B includes two bus bars 24 and five fingers 22 extending from one of the bus bars 24 and six fingers 22 extending from the other bus bar 24. Any suitable number of fingers for a particular application can extend from the bus bars 24. Each finger 22 has a proximate end 22*a* that is in contact with a bus bar 24 and a distal end 22*b* opposite the proximate end 22*a*. A body portion 22*c* of the finger 22 extends between the proximate end 22*a* and the distal end 22*b*. A portion near the distal end 22*b* can be referred as an edge portion. An aperture 27 of the SAW resonator 1 can be defined by the region between distal ends of the fingers 22 extending from opposing bus bars 24.

In certain applications, the high density metal strip layer 18 of the metal strip 16 can include any suitable metal that has a density that is equal to or greater than the density of the first layer 26 (or the lower electrode layer) of the IDT electrode 12. The conductive strip 16 includes a layer having a density at least as high as a density of a material of the first layer 26. For example, the high density metal strip layer 18 can include molybdenum (Mo), tungsten (W), gold (Au), silver (Ag), ruthenium (Ru), iridium (Ir), or the like, depending on the density of the first layer 26 of the IDT electrode 12.

The metal strip 16 has an inner sidewall 16*a* and an outer sidewall 16*b* that extend between a bottom side 16*c* and a top side 16*d* of the metal strip 16. The outer sidewall 16*b* of the metal strip 16 is illustrated as being aligned with the distal ends 22*b* of the fingers 22 having a gap 25 between the outer sidewall 16*b* and the bus bar 24. However, in some embodiments, the outer sidewall 16*b* can be anywhere between the distal end 22*b* of the finger 22 that extends from one bus bar 24 and the other bus bar 24. In some other embodiments, the outer sidewall 16*b* may overlap with the bus bar 24 or be outside of the IDT electrodes 12.

The temperature compensation layer 14 has a thickness t1 measured from a lower surface 14*a* to an upper surface 14*b* opposite the lower surface 14*a*. In some embodiments, the thickness t1 of the temperature compensation layer 14 can be in a range from 0.1 L to 0.5 L. For instance, the thickness t1 can be about 0.3 L in certain applications. For example, when the wavelength L is about 4 μm, the thickness t1 of the temperature compensation layer 14 can be about 1200 nm.

The first layer 26 of the IDT electrode 12 has a thickness t2 and the second layer 28 of the IDT electrode 12 has a thickness t3. In some embodiments, the thickness t2 of the first layer 26 can be in a range from 0.03 L to 0.10 L (e.g., about 0.08 L) and the thickness t3 of the second layer 28 can be in a range from 0.02 L to 0.08 L (e.g., about 0.04 L). For example, when the wavelength L is about 4 μm, the thickness t2 of the first layer 26 can be about 320 nm and the thickness t3 of the second layer 28 can be about 160 nm.

The metal strip 16 has a thickness t4 between the bottom side 16*c* and the top side 16*d*. The thickness t4 of the metal strip 16 can be a thickness of the high density metal strip layer 18 in the illustrated embodiment of FIGS. 1A and 1B. The thickness t4 of the metal strip 16 can be selected based at least in part on a wavelength λ, or L of a surface acoustic wave generated by the surface acoustic wave resonator 1. For example, the thickness t4 of the metal strip 16 can be in a range from 0.01 L to 0.03 L in certain applications. The metal strip 16 has a width w1 from the inner sidewall 16*a* to the outer sidewall 16*b* of the metal strip 16. For example, the width w1 of the metal strip can be in a range from 0.5 L to 1.5 L. The gap 25 has a width w2 from the outer sidewall 16*b* and the bus bar 24. For example, the width w2 of the gap can be greater than 0.9 L.

The buffer layer 17 has a thickness t5. In some embodiments, the thickness t5 of the buffer layer 17 can be at least one fourth the thickness t4 of the metal strip 16. For example, the thickness t5 of the buffer layer 17 can be in a range between one fourth the thickness t4 of the metal strip 16 and the thickness t4 of the metal strip 16. Selection of the thicknesses t1-t5 and the width w1, w2 from the ranges disclosed herein can be critical in providing the advantages disclosed herein.

Figures 1C, 1D:
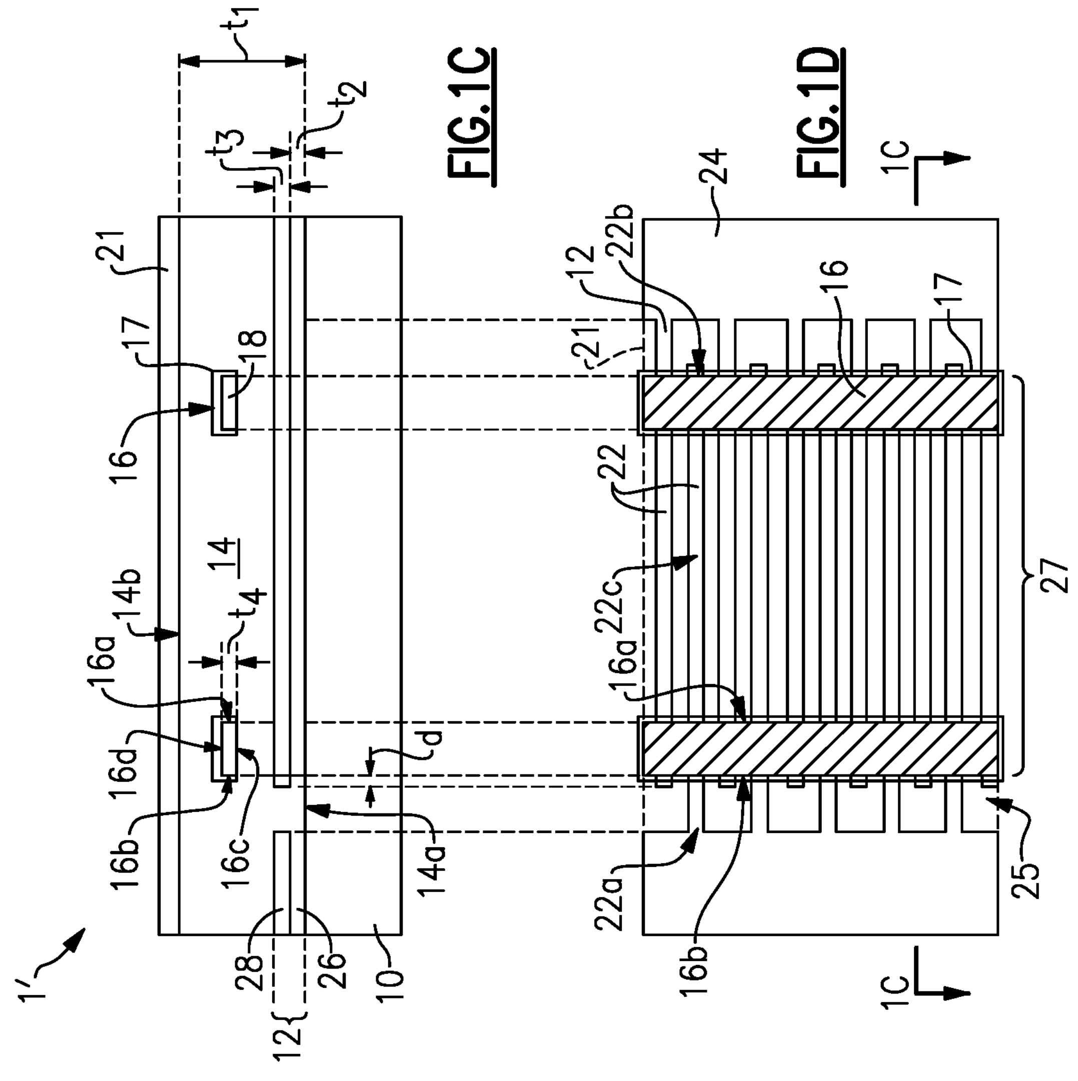
FIG. 1C illustrates a schematic cross-sectional side view of a SAW resonator according to an embodiment.
FIG. 1D illustrates a top view of the SAW resonator of FIG. 1C.

FIG. 1C illustrates a schematic cross-sectional side view of a surface acoustic wave (SAW) resonator 1' along the line 1C-1C in FIG. 1D according to an embodiment. FIG. 1D illustrates a top plan view of the SAW resonator 1' of FIG. 1C. The SAW resonator 1' of FIGS. 1C and 1D is like the SAW resonator 1 of FIGS. 1A and 1B, except that the metal strip 16 of the SAW resonator 1' is offset or shifted by a displacement distance d. Even through the metal strip 16 is shifted in the SAW resonator 1', the metal strip 16 overlaps the edge portions of fingers 22 in the SAW resonator 1'. FIGS. 1C and 1D illustrate that a mass loading strip (e.g., the metal strip 16) can overlap the edge portions of fingers 22 of an IDT electrode 12 in cases where the fingers 22 extend a relatively small amount beyond the mass loading strip.

As illustrated, the metal strip 16 can be positioned over edge portion near the distal end 22*b* of a finger 22. In some applications, the displacement distance d can be up to 0.1 λ. For example, the displacement d can be in a range from 0.01 λ to 0.1 λ. In some applications, the displacement d can be up to 400 nm. For example, the displacement d can be in a range from 10 nm to 400 nm. With such displacements, the performance of the SAW resonator 1' should not be significantly degraded relative to the SAW resonator 1.

Figures 2A, 2B:
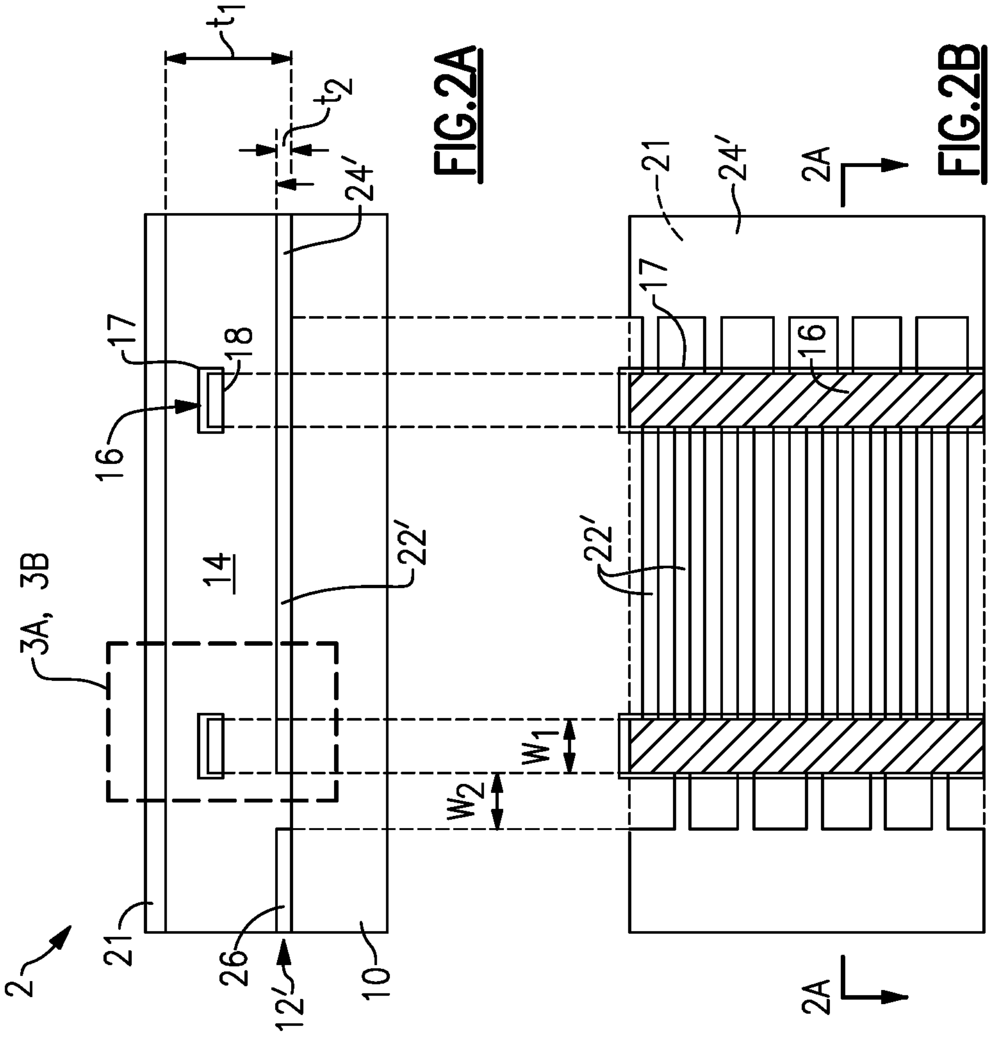
FIG. 2A illustrates a schematic cross-sectional side view of a SAW resonator according to an embodiment.
FIG. 2B illustrates a top view of the SAW resonator of FIG. 2A.

FIG. 2A illustrates a schematic cross-sectional side view of a surface acoustic wave (SAW) resonator 2 according to an embodiment. FIG. 2B is a top plan view of the IDT electrodes 12' and the metal strip 16 of the SAW resonator 2 of FIG. 2A. The SAW resonator 2 illustrated in FIGS. 2A and 2B is generally similar to the resonator 1 illustrated in FIGS. 1A and 1B. However, unlike the IDT electrodes 12 of the resonator 1 illustrated in FIG. 1A, the IDT electrodes 12' of the SAW resonator 2 illustrated in FIGS. 2A and 2B include a single conductive layer (e.g., the layer 26). The IDT electrode 12' includes fingers 22' and bus bars 24'. As illustrated, the IDT electrodes 12' of the SAW resonator 2 include a tungsten (W) layer. The IDT electrode 12' may include any suitable metal for functioning as an IDT electrode.

Figure 3A:
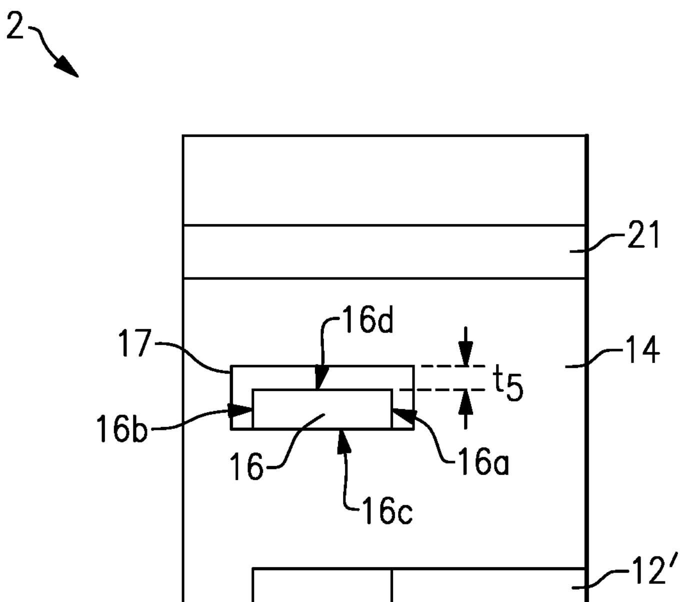
FIG. 3A is a portion of the schematic cross-sectional side view of the SAW resonator illustrated in FIG. 2A, according to an embodiment.
Figure 3B:
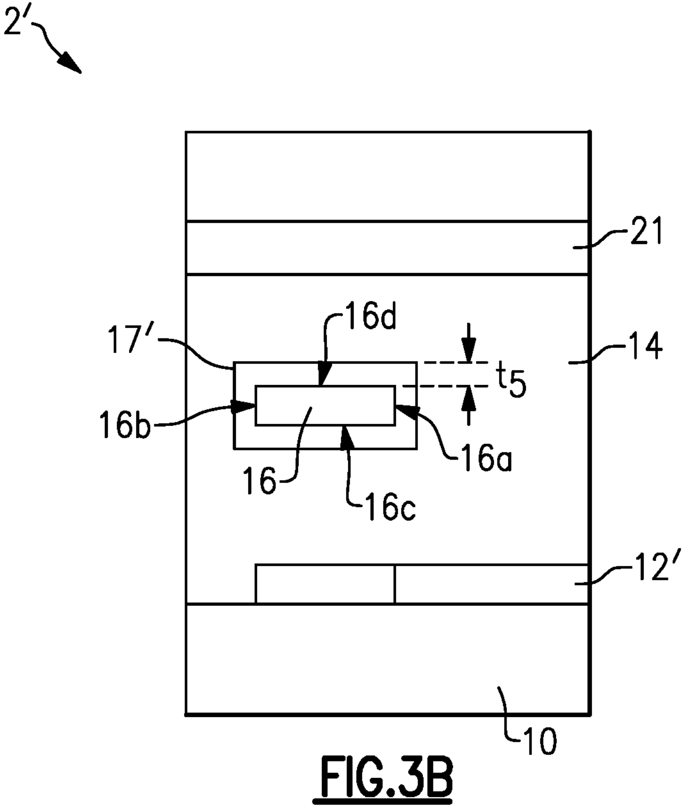
FIG. 3B is a portion of a schematic cross-sectional side view of a SAW resonator, according to another embodiment.

FIG. 3A is a portion of the schematic cross-sectional side view of the SAW resonator 2 illustrated in FIG. 2A showing the buffer layer 17 that is disposed between the inner sidewall 16*a*, the outer sidewall 16*b*, and the top side 16*d* of the metal strip 16 and the temperature compensation layer 14. FIG. 3B is a portion of a schematic cross-sectional side view of a SAW resonator 2' similar to the SAW resonator 2 showing a buffer layer 17' that is disposed between an inner sidewall 16*a*, an outer sidewall 16*b*, a bottom side 16*c*, and a top side 16*d* of the metal strip 16 and the temperature compensation layer 14. As shown in FIGS. 3A and 3B, the metal strip 16 can be partially or completely separated from the temperature compensation layer 14.

In an acoustic wave device that includes a metal strip, a void may be formed in a temperature compensation layer along a surface (e.g., a sidewall, a top surface, and/or a bottom surface) of the metal strip. Such a void can negatively affect suppression of the transverse mode. Especially, when a size of the void is relatively large, a proper transverse mode suppression may not be obtained. The buffer layer 17, 17' can minimize the size of the void or prevent and/or mitigate formation of the void.

Figure 4A:
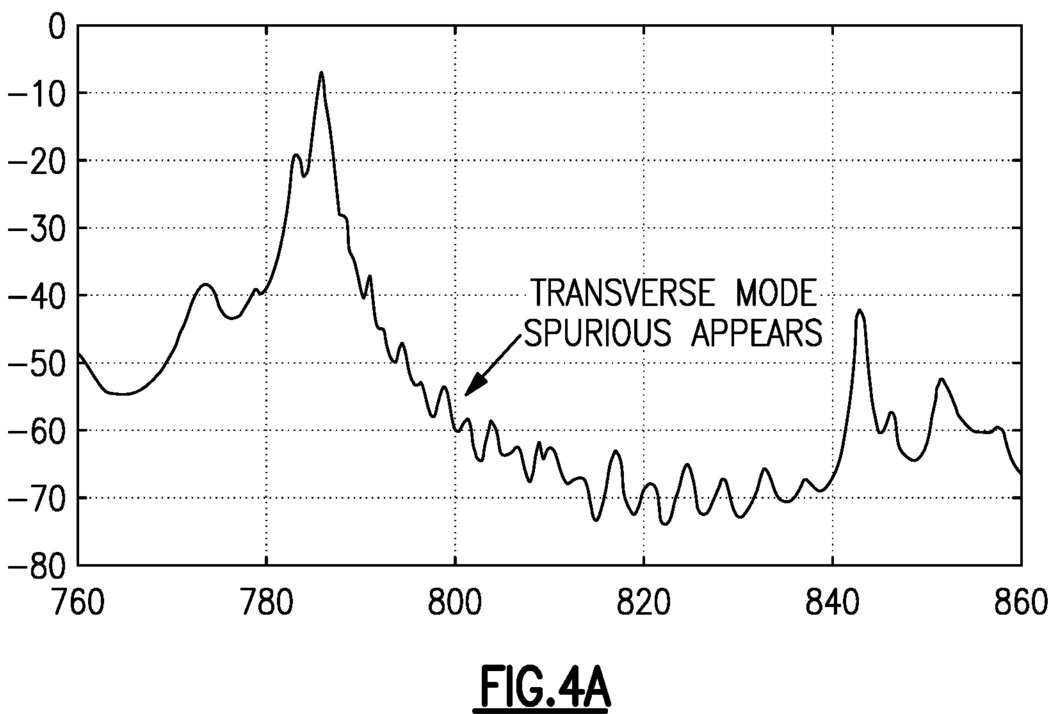
FIG. 4A is a graph showing measurement result of a SAW resonator.

FIG. 4A is a graph showing a measurement result of a measurement taken with a SAW resonator. The SAW resonator used in the measurement is similar to the SAW resonator 2 illustrated in FIGS. 2A and 2B. However, unlike the SAW resonator 2, the SAW resonator used in the measurement does not include the buffer layer 17. The measurement result shows transverse mode spurious that negatively affect the performance of the SAW resonator.

Figure 4B:
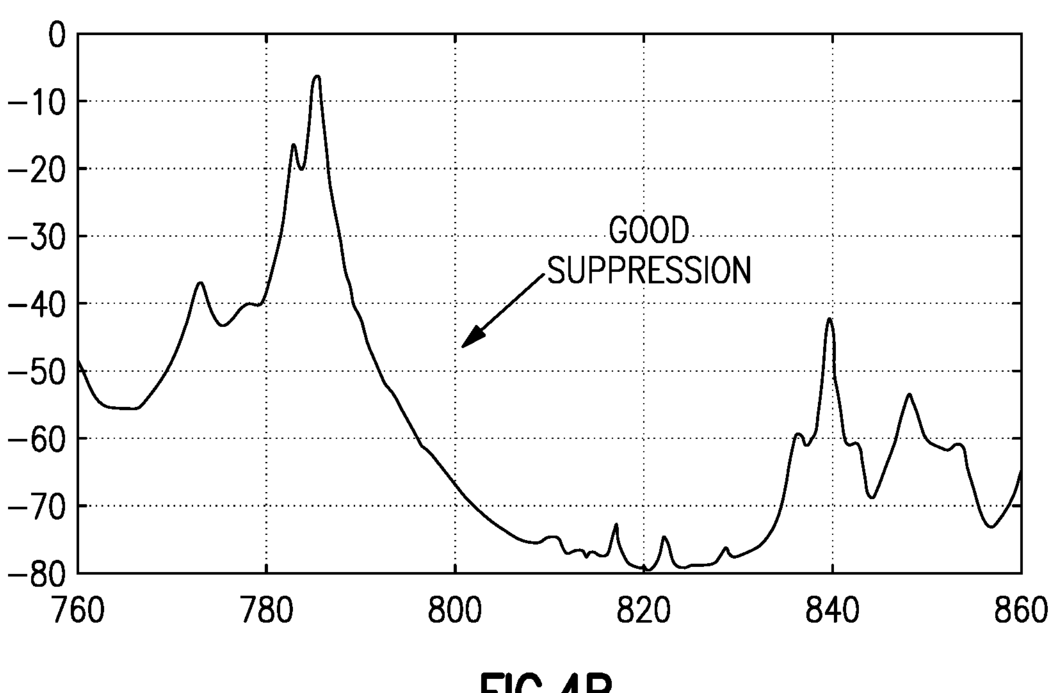
FIG. 4B is a graph showing measurement result of the SAW resonator illustrated in FIG. 2A.

FIG. 4B is a graph showing a measurement result of a measurement taken with the SAW resonator 2 illustrated in FIGS. 2A and 2B. Comparing the results of FIG. 4A and FIG. 4B, the measurement results indicate that the transverse mode spurious is suppressed in the SAW resonator 2. The suppression of the transverse mode spurious is achieved at least in part by the buffer layer 17.

Figures 5A, 5B, 5C:
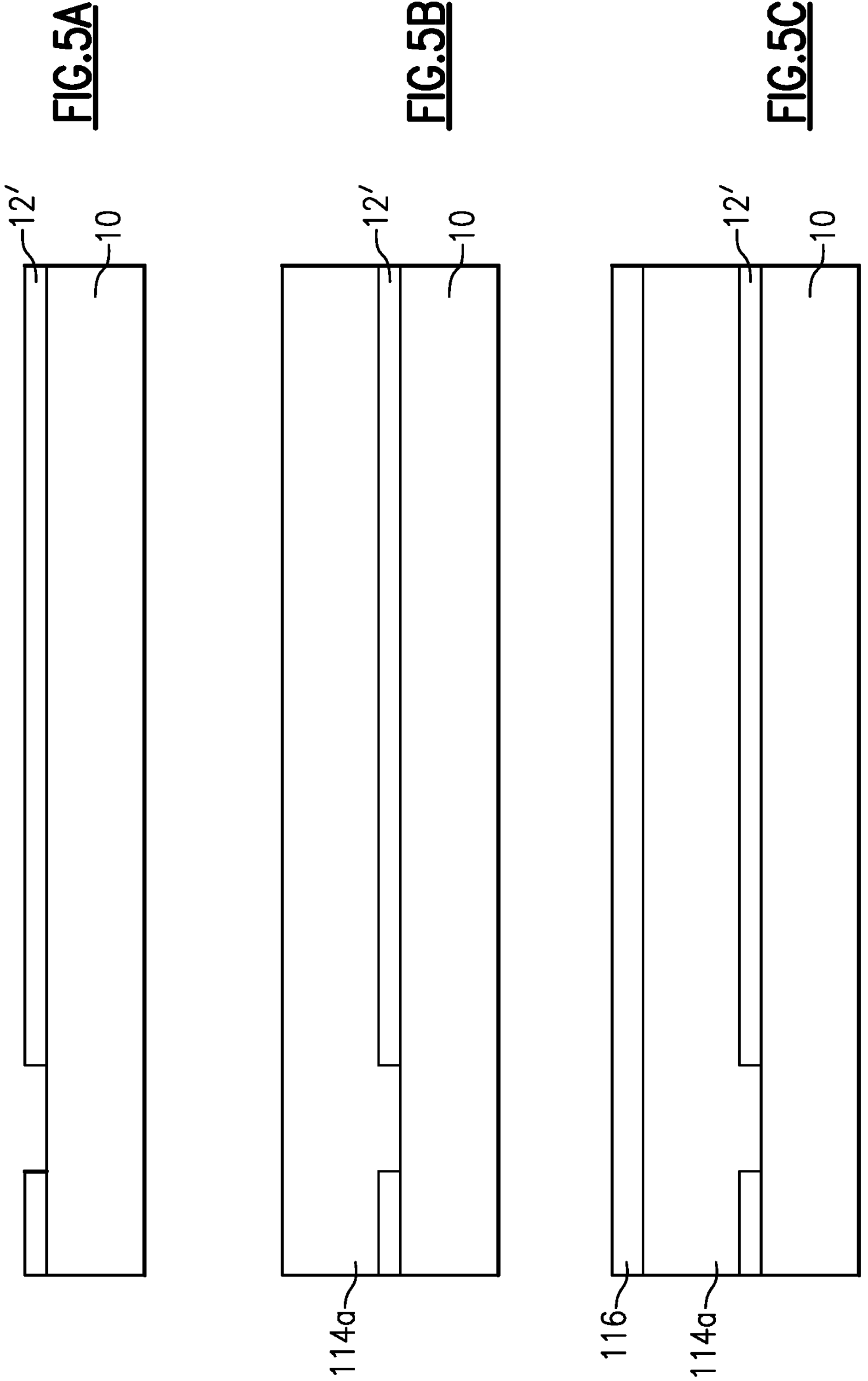
FIG. 5A illustrates a step in a manufacturing process of a SAW resonator.
FIG. 5B illustrates a step in another manufacturing process of a SAW resonator.
FIG. 5C illustrates a step in another manufacturing process of a SAW resonator.

FIGS. 5A to 5F illustrate steps in manufacturing processes of manufacturing SAW resonators 2, 2', according to some embodiments. In FIG. 5A, an interdigital transducer (IDT) electrodes 12' can be formed on a piezoelectric layer 10. The piezoelectric layer 10 can include any suitable piezoelectric layer material, such as a lithium niobate (LN) layer or a lithium tantalate (LT) layer. The IDT electrodes 12' of the SAW resonator 2 can include a single conductive layer (e.g., the layer 26).

In FIG. 5B, a lower layer 114*a* of a temperature compensation layer 14 can be formed over the IDT electrodes 12'. In some embodiments, the lower layer 114*a* of the temperature compensation layer 14 can be formed by way of deposition. The temperature compensation layer 14 can include any suitable temperature compensation material. For example, the temperature compensation layer 14 can be a silicon dioxide ($SiO_2$) layer. The temperature compensation layer 14 can be a layer of any other suitable material having a positive temperature coefficient of frequency for SAW resonators with a piezoelectric layer 10 having a negative coefficient of frequency.

In FIG. 5C, a metal layer 116 can be formed on the lower layer 114*a* of the temperature compensation layer 14. In some embodiments, the metal layer 116 can be formed by way of deposition. In certain applications, a mass loading layer of any suitable non-metal and/or non-conductive material that has a density that is equal to or greater than a density of a most dense layer (e.g., the layer 26) of the IDT electrode 12 can be implemented in place of the metal layer 116. Such a non-conductive layer can be a heavy dielectric layer such as tantalum pentoxide (Ta2O5), tellurium dioxide (TeO2), or a like dielectric material.

Figures 5D, 5E, 5F:
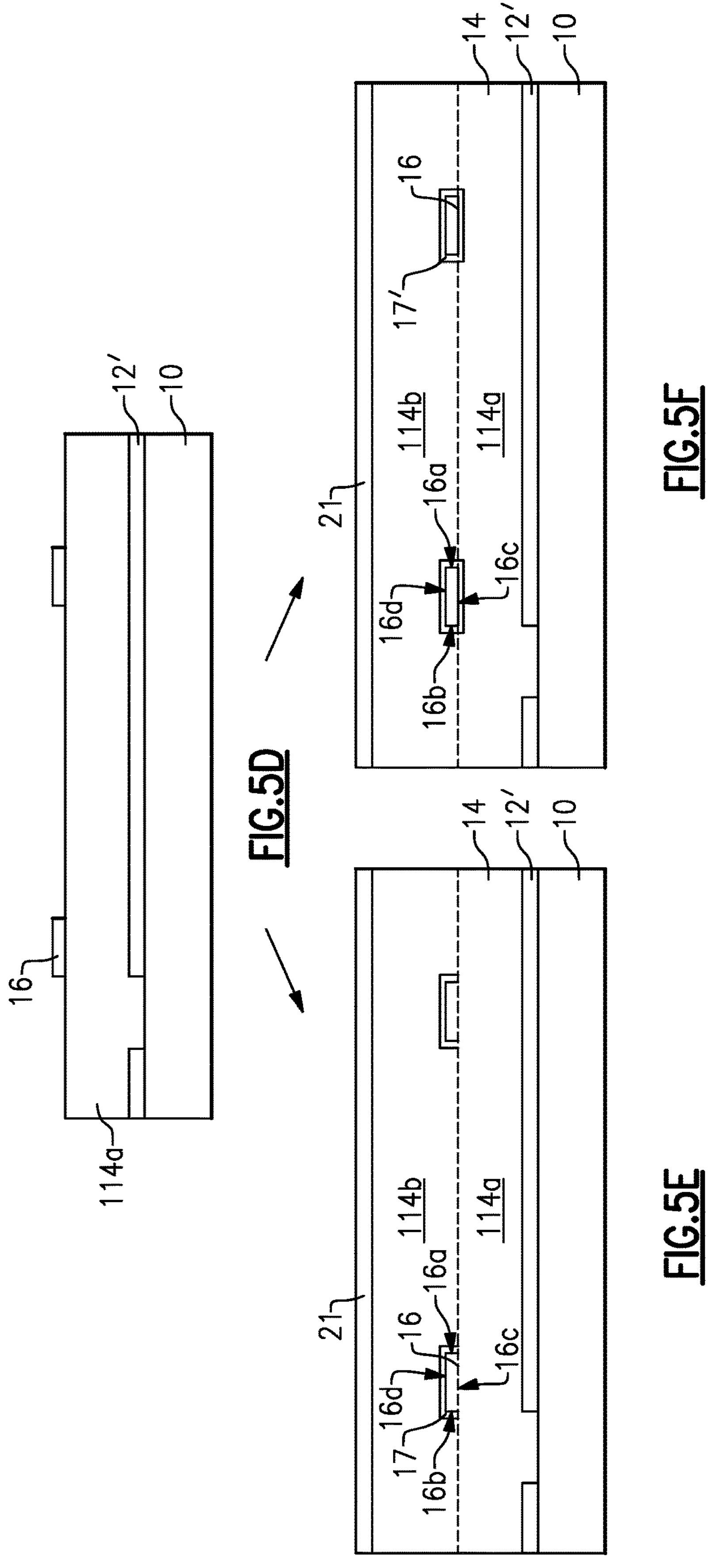
FIG. 5D illustrates a step in another manufacturing process of a SAW resonator.
FIG. 5E illustrates a step in another manufacturing process of a SAW resonator.
FIG. 5F illustrates a step in another manufacturing process of a SAW resonator.

In FIG. 5D, a metal strip 16 can be formed. The metal strip 16 can be formed by removing portions of the metal layer 116. In some embodiments, the metal strip 16 can be formed by removing the portions of the metal layer 116 by way of etching (e.g., dry etching or wet etching).

After the step shown in FIG. 5D, a buffer layer 17, an upper layer 114*b*, and a dispersion adjustment layer 21 can be formed. As shown in FIG. 5E, the buffer layer 17 can be formed between an inner sidewall 16*a*, an outer sidewall 16*b*, and a top side 16*d* of the metal strip 16 and the temperature compensation layer 14. As shown in FIG. 5F, the buffer layer 17' can be formed between an inner sidewall 16*a*, an outer sidewall 16*b*, a bottom side 16*c*, and a top side 16*d* of the metal strip 16 and the temperature compensation layer 14.

In FIGS. 5E and 5F, an upper layer 114*b* of the temperature compensation layer 14 can be formed over the lower layer 114*a*. In some embodiments, the upper layer 114*b* of the temperature compensation layer 14 can be formed by way of deposition. In some embodiments, materials of the lower layer 114*a* and the upper layer 114*b* can be the same. In some other embodiments, materials of the lower layer 114*a* and the upper layer 114*b* can be different. A dashed line in FIGS. 5E and 5F indicates an interface between the lower layer 114*a* and the upper layer 114*b*.

The deposition process can include a sputter deposition. A sputtering temperature for forming the upper layer 114*b* can be in a range between 200° C. and 300° C. In some embodiments, during the deposition process, materials (e.g., chemical components) of the upper layer 114*b* and the metal strip 16 can react with each other, thereby forming the buffer layer 17 as shown in FIG. 5E.

In some embodiments, the temperature compensation layer 14 and the metal strip 16 can be annealed at a temperature in a range between, for example, 300° C. and 400° C. During the deposition process, materials (e.g., chemical components) of the upper layer 114*b* and the metal strip 16 can react with each other, thereby forming the buffer layer 17' as shown in FIG. 5F.

In some embodiments, the buffer layer 17 can be formed by way of deposition with or without relying on application of heat to form the buffer layer 17, 17'. For example, the buffer layer 17, 17' can be deposited over the metal strip 16. For example, the buffer layer 17' can be deposited on the lower layer 114*a* before forming the metal strip 16.

In FIGS. 5E and 5F, a dispersion adjustment layer 21 can be formed over the temperature compensation layer 14. The dispersion adjustment layer 21 can serve as a passivation layer and/or a trimming layer for frequency trimming. After the formation of the dispersion adjustment layer 21, the SAW resonator can be heated or baked. The heating or baking process can evaporate moisture in the temperature compensation layer 14 and/or the dispersion adjustment layer 21 so as to prevent or mitigate frequency changes in the final product. In some embodiments, the SAW resonator can be heated at a temperature in a range between, for example, 300° C. and 400° C.

Any SAW resonator disclosed herein can be manufactured in the same or generally similar manner as the manufacturing processes illustrated in FIGS. 5A-5F.

FIGS. 1A-3B illustrate example SAW resonators according to some embodiments. Any suitable principles and advantages disclosed herein can be applied to various other SAW resonators. Other example embodiments of SAW resonators will be discussed with reference to FIGS. 6A to 15B. Any suitable combination of features of the embodiments disclosed herein can be implemented together with each other.

Figures 6A, 6B:
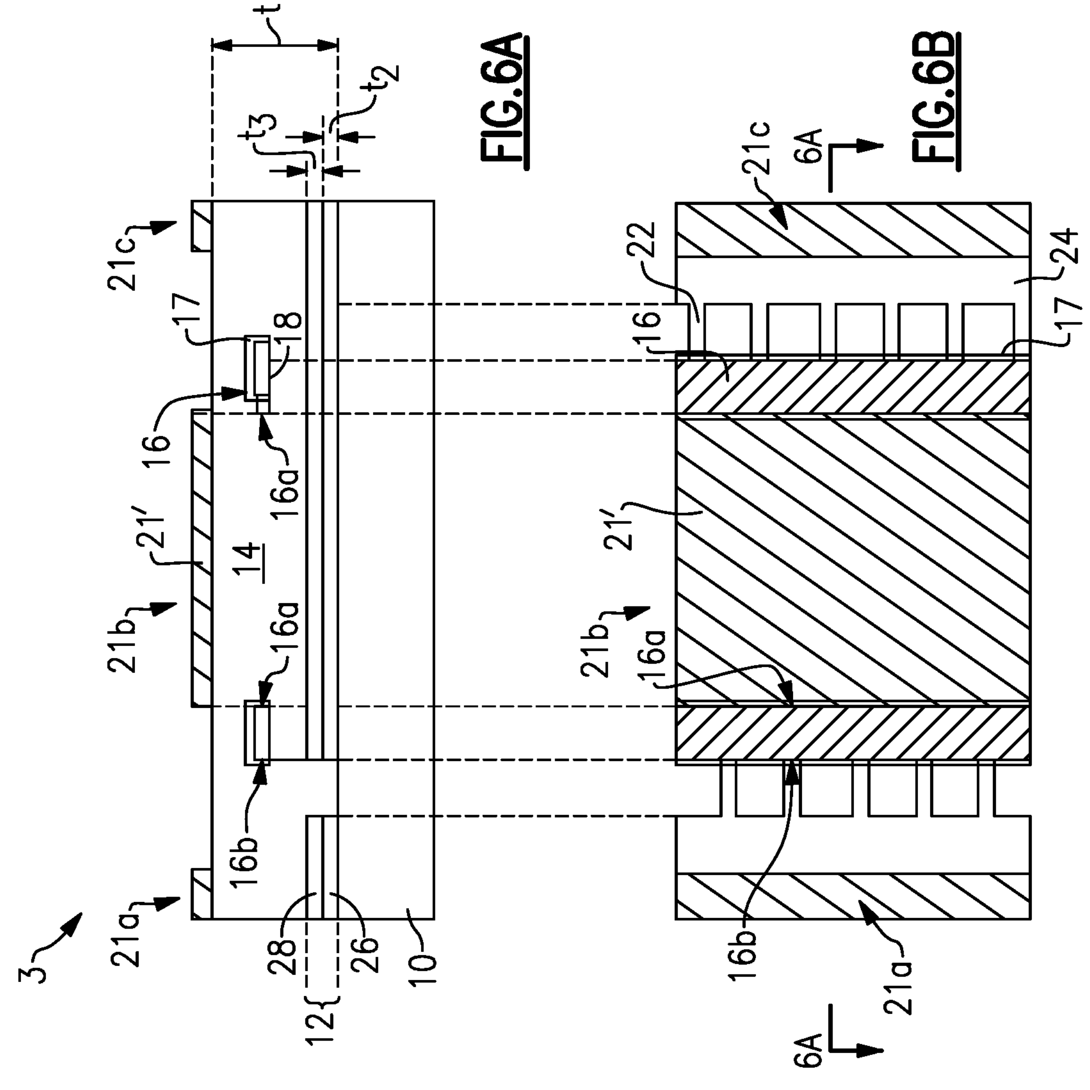
FIG. 6A illustrates a schematic cross-sectional side view of a SAW resonator according to another embodiment.
FIG. 6B illustrates a top view of the SAW resonator of FIG. 6A.

FIG. 6A illustrates a schematic cross-sectional side view of a surface acoustic wave (SAW) resonator 3 according to an embodiment. FIG. 6B is a top plan view of the IDT electrodes 12, the metal strip 16, the buffer layer 17, and the dispersion adjustment layer 21' of the SAW resonator 2 of FIG. 6A. The resonator 3 illustrated in FIGS. 6A and 6B is generally similar to the resonator 1 illustrated in FIGS. 1A and 1B. However, unlike the dispersion adjustment layer 21 of the resonator 1 illustrated in FIG. 1A, the dispersion adjustment layer 21' of the resonator 3 illustrated in FIGS. 6A and 6B is disposed over parts of the temperature compensation layer 14. The illustrated SiN dispersion adjustment layer 21' layer includes a first SiN portion 21*a*, a second SiN portion 21*b*, and a third SiN portion 21*c*. The first and third SiN portions 21*a*, 21*c* are disposed over the bus bars 24 of the IDT electrodes 12 and the second SiN portion 21*b* is disposed between the inner sidewall 16*a* of the metal strips 16 on opposing sides of the SAW resonator 3. The space between the first SiN portion 21*a* and the second SiN portion 21*b*, and/or between the second SiN portion 21*b* and the third SiN portion 21*c* may be referred as a trench. The dispersion adjustment layer 21' can cause a magnitude of the velocity in the underlying region of the SAW resonator 3 to be increased. In certain applications, another suitable material can be implemented in place of the SiN for the dispersion adjustment layer 21' to increase the magnitude of the velocity of the underlying region of the SAW resonator 3.

Figures 6C, 6D:
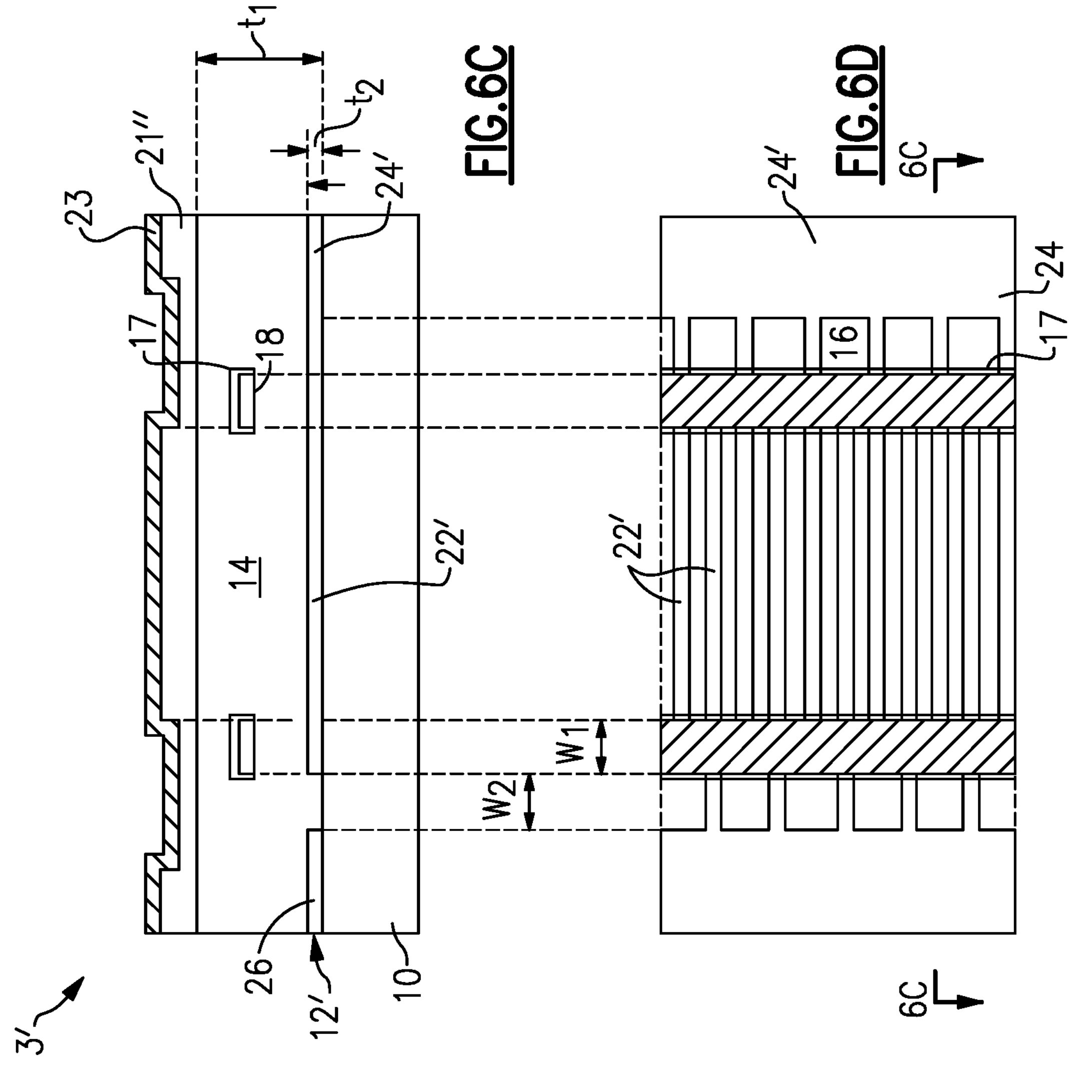
FIG. 6C illustrates a schematic cross-sectional side view of a SAW resonator according to another embodiment.
FIG. 6D illustrates a top view of the SAW resonator of FIG. 6C.

FIG. 6C illustrates a schematic cross-sectional side view of a surface acoustic wave (SAW) resonator 3' according to an embodiment. FIG. 6D is a top plan view of the IDT electrodes 12, the metal strip 16, and the buffer layer 17, the dispersion adjustment layer 21" and a passivation layer 23 of the SAW resonator 3' of FIG. 6C. The dispersion adjustment layer 21" can include silicon nitride (SiN). The passivation layer 23 can include at least one of silicon dioxide, aluminum oxide, silicon carbide, aluminum nitride, silicon nitride, or silicon oxynitride.

In some embodiments, the dispersion adjustment layer 21" can have a thickness up to 150 nm. For example, the dispersion adjustment layer 21" can have a thickness in a range from 1 nm to 150 nm, in a range from 10 nm to 150 nm, in a range from 50 nm to 150 nm, in a range from 1 nm to 100 nm, in a range from 50 nm to 100 nm, or in a range from 70 nm to 100 nm. In some other embodiments, the thickness of the dispersion adjustment layer 21" can be thicker than 150 nm. As illustrated in FIG. 6C, certain portions of the dispersion adjustment layer 21" can be thinner than other portions of the dispersion adjustment layer 21". The dispersion adjustment layer 21" can cause a magnitude of the velocity in the underlying region of the SAW resonator 3' to be increased. A region of the SAW resonator 3' below a thicker portion of the dispersion adjustment layer 21" can have a velocity that is greater than a velocity of a region below a thinner portion of the dispersion adjustment layer 21".

In some embodiments, the passivation layer 23 can have a thickness up to about 100 nm. For example, the passivation layer 23 can be in a range from 1 nm to 100 nm, in a range from 10 nm to 100 nm, in a range from 50 nm to 100 nm, in a range from 1 nm to 50 nm, in a range from 10 nm to 50 nm, or in a range from 50 nm to 70 nm. In some other embodiments, the thickness of the passivation layer 23 can be thicker than 100 nm.

Figures 7A, 7B:
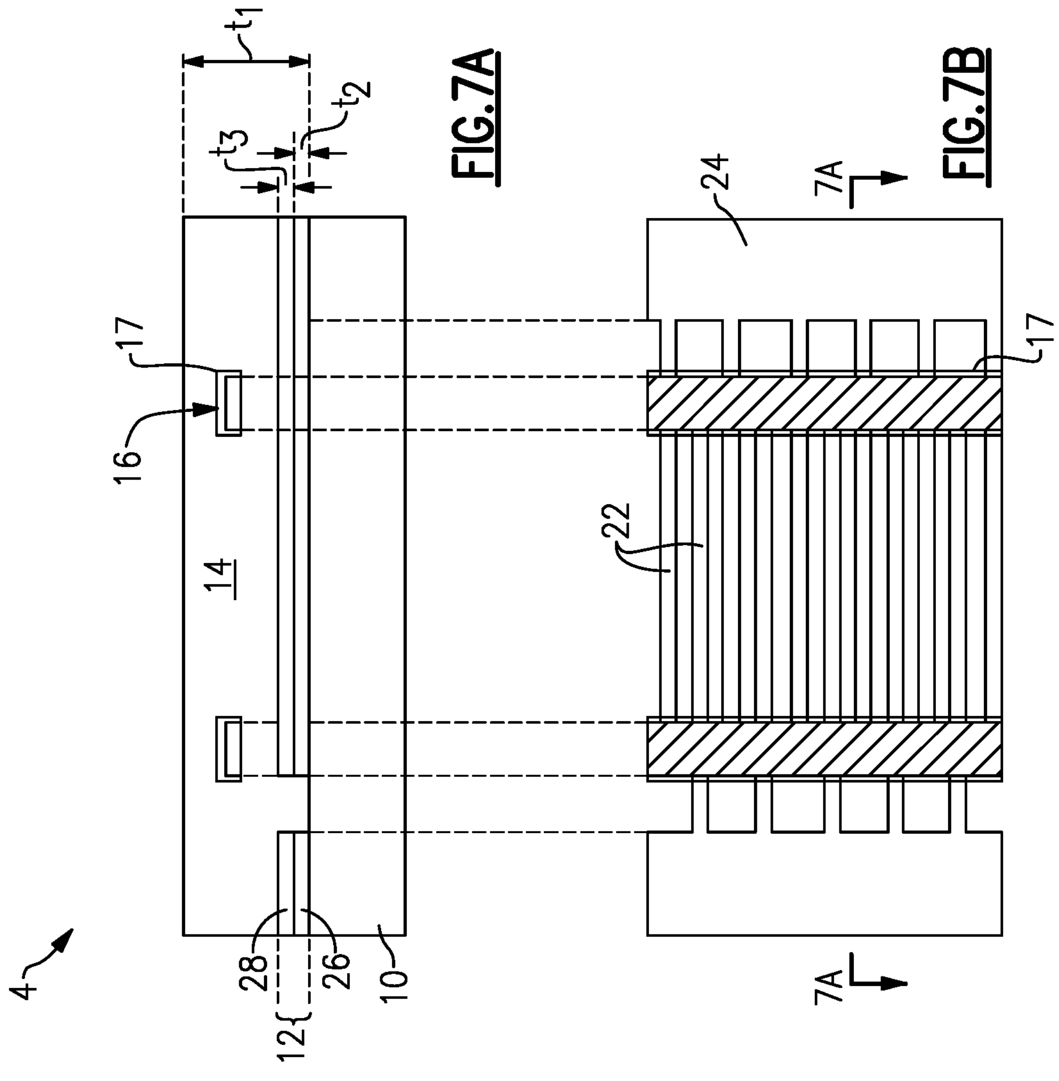
FIG. 7A illustrates a schematic cross-sectional side view of a SAW resonator according to another embodiment.
FIG. 7B illustrates a top view of the SAW resonator of FIG. 7A.

FIG. 7A illustrates a schematic cross-sectional side view of a surface acoustic wave (SAW) resonator 4 according to an embodiment. FIG. 7B is a top plan view of the IDT electrodes 12 and the metal strip 16 of the SAW resonator 4 of FIG. 7A. The resonator 4 illustrated in FIGS. 7A and 7B is generally similar to the resonator 1 illustrated in FIGS. 1A and 1B. However, unlike the resonator 1 illustrated in FIGS. 1A and 1B, the SAW resonator 4 illustrated in FIGS. 7A and 7B does not include a dispersion adjustment layer 21 over the temperature compensation layer 14. The SAW resonator 4 illustrates that suitable piston mode operation can be achieved without a dispersion adjustment layer over a temperature compensation layer in certain applications.

Figures 8A, 8B:
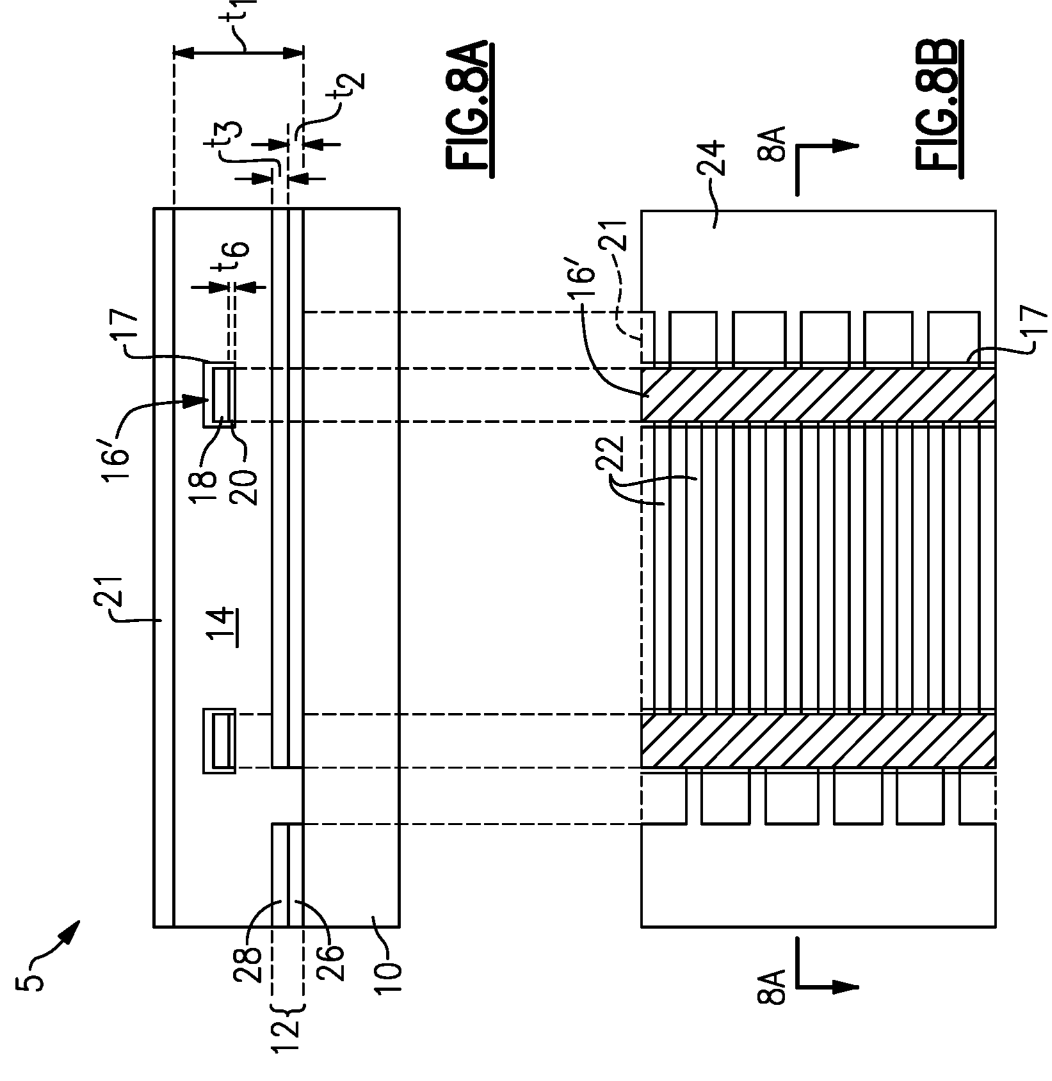
FIG. 8A illustrates a schematic cross-sectional side view of a SAW resonator according to another embodiment.
FIG. 8B illustrates a top view of the SAW resonator of FIG. 8A.

FIG. 8A illustrates a schematic cross-sectional side view of a surface acoustic wave (SAW) resonator 5 according to an embodiment. FIG. 8B is a top plan view of the IDT electrodes 12 and a metal strip 16' of the SAW resonator 5 of FIG. 8A. The resonator 5 illustrated in FIGS. 8A and 8B is generally similar to the resonator 1 illustrated in FIGS. 1A and 1B. However, unlike the metal strip 16 illustrated in FIGS. 1A and 1B, the metal strip 16' illustrated in FIGS. 8A and 8B includes an adhesion layer 20. Accordingly, the metal strip 16' illustrated in FIGS. 8A and 8B is a multi-layer conductive strip. The adhesion layer 20 of the metal strip 16' can provide a better adhesion with the temperature compensation layer 14 than the adhesion between the high density metal strip layer 18 with the temperature compensation layer 14. For example, the adhesion layer 20 can include titanium (Ti), titanium nitride (TiN), aluminum nitride (AlN), tantalum pentoxide ($Ta_2O_5$), or the like. Some materials, such as Ti, can provide a better polarization than a metal strip with different material for the adhesion layer 20 or without the adhesion layer 20. Accordingly, in certain applications, the adhesion layer 20 can be a titanium layer that provides desirable adhesion and desirable polarization. The metal strip 16' may be formed in any suitable manner. For example, the adhesion layer 20 may be provided over the temperature compensation layer 14 by way of deposition and the high density metal strip layer 18 may be provided over the adhesion layer 20 by way of deposition.

The adhesion layer 20 can have any suitable thickness t6 that can provide an improved adhesion as compared to the metal strip 16 without the adhesion layer 20. For example, the thickness t6 can be less than about 50 nm. In certain embodiments, the thickness t6 of the adhesion layer 20 can be in a range from 10 nm to 50 nm to provide an improved polarization.

Figures 9A, 9B:
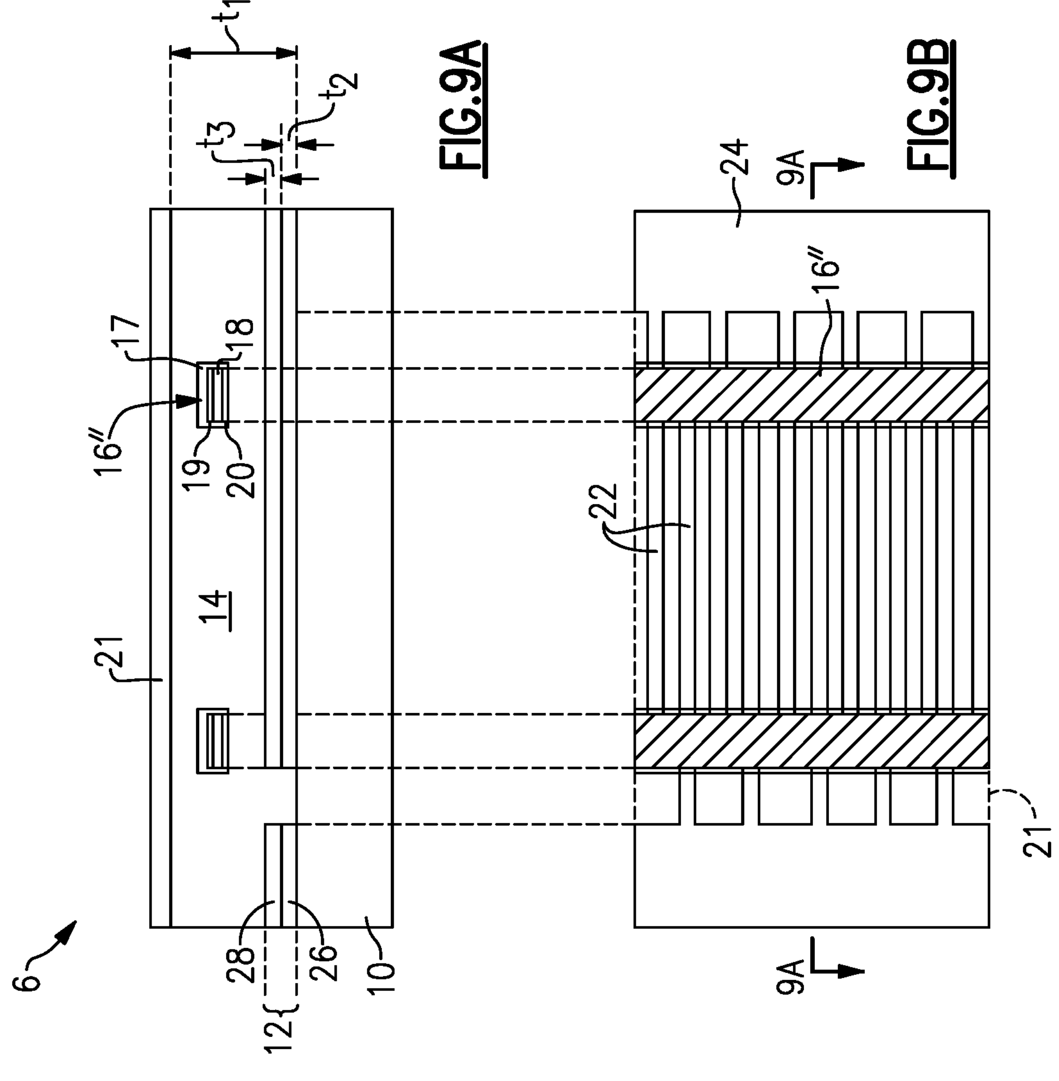
FIG. 9A illustrates a schematic cross-sectional side view of a SAW resonator according to another embodiment.
FIG. 9B illustrates a top view of the SAW resonator of FIG. 9A.

FIG. 9A illustrates a schematic cross-sectional side view of a surface acoustic wave (SAW) resonator 6 according to an embodiment. FIG. 9B is a top plan view of the IDT electrodes 12 and the metal strip 16" of the SAW resonator 6 of FIG. 9A. The resonator 6 illustrated in FIGS. 9A and 9B is generally similar to the resonator 5 illustrated in FIGS. 8A and 8B. However, unlike the metal strip 16 illustrated in FIGS. 8A and 8B, the metal strip 16" illustrated in FIGS. 9A and 9B includes three layers. A multi-layer metal strip in accordance with the principles and advantages disclosed herein can include more than three layers in some other embodiments.

As illustrated in FIG. 9A, the metal strip 16" includes a first layer (e.g., an adhesion layer 20), a second layer (e.g., a high density metal strip layer 18), and a third layer 19. The third layer 19 can be a second adhesion layer. The adhesion layer 20 and the third layer 19 can provide a better adhesion with the temperature compensation layer 14 than the adhesion between the high density metal strip layer 18 with the temperature compensation layer 14. The second adhesion layer can be a titanium layer (e.g., a layer that includes titanium). In certain instances, the adhesion layer 20 and the second adhesion layer 19 can be of the same material. For example, the metal strip 16" can be a titanium/high density metal/titanium strip. The second adhesion layer can include titanium nitride (TiN), aluminum nitride (AlN), tantalum pentoxide ($Ta_2O_5$), or the like in some other instances.

In some other embodiments, a multi-layer conductive strip can include two or more layers of high density metal. The high density metal layers can be of different high density material. Example high density metals include molybdenum (Mo), tungsten (W), gold (Au), silver (Ag), ruthenium (Ru), copper (Cu), platinum (Pt), iridium (Ir) or the like.

The conductive strips disclosed herein can be disposed at any suitable position that is a distance r from the piezoelectric layer 10 (or from the lower surface 14*a* of the temperature compensation layer 14). The distance r may be selected relative to the thickness t1 of the temperature compensation layer 14. For example, the distance r can be in a range from 0.2×t1 to 0.8×t1 in some embodiments, in which t1 is the thickness of the temperature compensation layer 14. When the dispersion adjustment layer 21 is disposed over the temperature compensation layer 14, it may be preferable for the distance r to be in a range from 0.4×t1 to 0.6×t1.

Figure 10A:
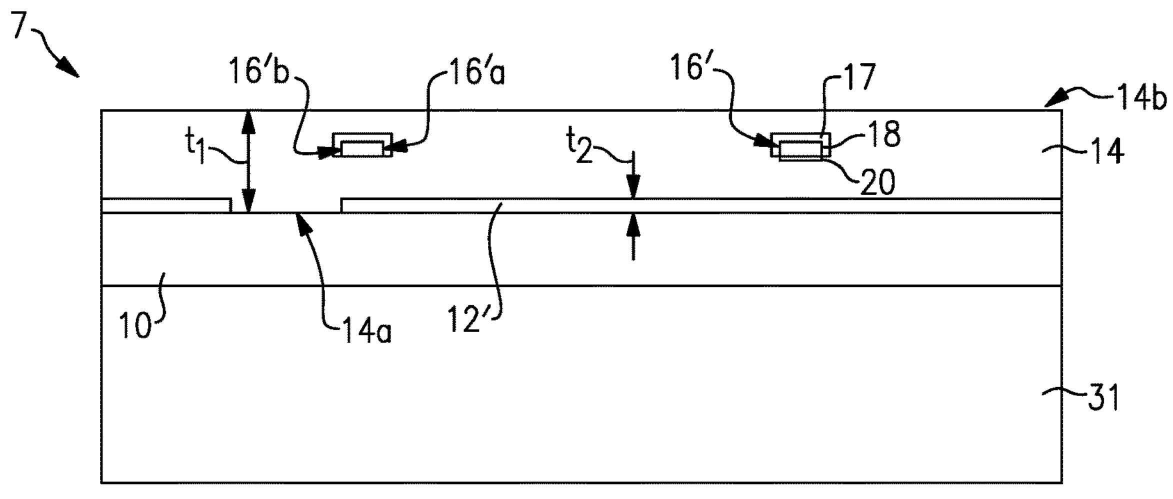
FIG. 10A illustrates a schematic cross-sectional side view of a SAW resonator having a multi-layer piezoelectric substrate according to another embodiment.

FIG. 10A illustrates a schematic cross-sectional side view of a SAW resonator 7 according to another embodiment. The SAW resonator 7 includes a piezoelectric layer 10, an IDT electrode 12' on the piezoelectric layer 10, a temperature compensation layer 14 over the IDT electrode 12', metal strip 16' embedded in the temperature compensation layer 14, and a support substrate 31 on a side of the piezoelectric layer 10 that is opposite to the IDT electrode 12'. FIG. 10A illustrates that a mass loading strip can be implemented in a SAW resonator with a multi-layer piezoelectric substrate (MPS). In certain applications, the piezoelectric layer 10 can have a thickness of less than the pitch k of the IDT electrode 12' in the SAW resonator 7. Such a piezoelectric layer 10 can have a thickness in a range from about 0.1 λ to 1 λ. For example, the piezoelectric layer 10 can have a thickness in a range from about 0.1 λ to 0.4 λ. In some other applications, the piezoelectric layer 10 can have a thickness in a range from about 1 λ to 40 λ of the pitch k of IDT electrode 12' in the SAW resonator 7. In certain instances, the thickness of the piezoelectric layer 10 can be in a range from 0.1 micrometer to 30 micrometers.

The support substrate 31 can be any suitable substrate layer, such as a silicon layer, a quartz layer, a ceramic layer, a glass layer, a spinel layer, a magnesium oxide spinel layer, a sapphire layer, a diamond layer, a silicon carbide layer, a silicon nitride layer, an aluminum nitride layer, or the like. As one example, the SAW resonator 7 can include a piezoelectric layer 10 that is a lithium niobate layer and a support substrate 31 that is silicon substrate.

The support substrate 31 can have a relatively high acoustic impedance. An acoustic impedance of the support substrate 31 can be higher than an acoustic impedance of the piezoelectric layer 10. For instance, the support substrate 31 can have a higher acoustic impedance than an acoustic impedance of lithium niobate and a higher acoustic impedance than lithium tantalate. The acoustic impedance of the support substrate 31 can be higher than an acoustic impedance of the temperature compensation layer 14. The SAW resonator 7 including the piezoelectric layer 10 on a support substrate 31 with relatively high thermal conductivity, such as silicon substrate, can achieve better thermal dissipation compared to a similar SAW resonator without the high impedance support substrate 31.

In certain embodiments, a SAW resonator can include two or more layers on the side of the piezoelectric layer 10 that is opposite to the IDT electrode 12'. In some embodiments, there can be an additional layer between the piezoelectric layer 10 and the support substrate 31. The additional layer can be a low impedance layer that has a lower acoustic impedance than the support substrate 31. In some embodiments, the additional layer can be a silicon dioxide (SiO2) layer. The additional layer can increase an adhesion strength between layers of the multi-layer piezoelectric substrate. In such applications, the additional layer can be referred to as an adhesion layer. Alternatively or additionally, the additional layer can increase heat dissipation in the SAW resonator relative to a similar SAW resonator without the additional layer. In such applications, the additional layer can be referred to as a heat dissipation layer. The additional layer can reduce back reflection of the support substrate in certain applications. In such applications, the additional layer can scatter back reflections by beam scattering. In some instances, the additional layer can be a polycrystalline spinel layer and the support substrate 31 can be a silicon layer.

Figure 10B:
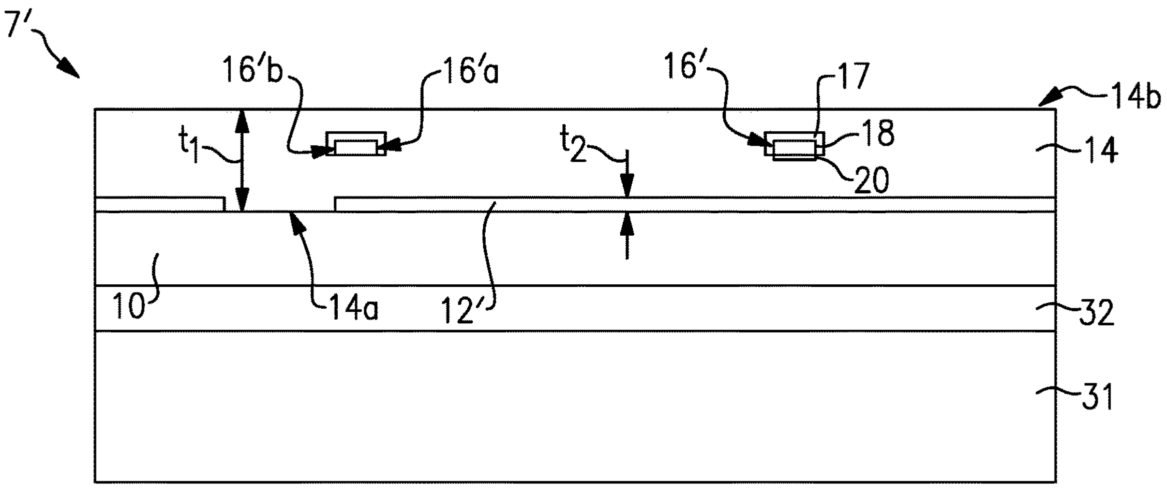
FIG. 10B illustrates a schematic cross-sectional side view of a SAW resonator having a multi-layer piezoelectric substrate according to another embodiment.

FIG. 10B illustrates a schematic cross-sectional side view of a SAW resonator 7' according to another embodiment. The SAW resonator 7' illustrated in FIG. 10B is generally similar to the resonator 7 illustrated in FIG. 10A. However, a multi-layer piezoelectric substrate of the SAW resonator 7' further includes a functional layer 32 between a piezoelectric layer 10 and the support substrate 31. The functional layer 32 can have a lower acoustic impedance than the support substrate 31. The functional layer 32 can increase adhesion between the support substrate 31 and the piezoelectric layer 10 of the multi-layer piezoelectric substrate. Alternatively or additionally, the functional layer 32 can increase heat dissipation in the SAW resonator 7' relative to the SAW device 7. The functional layer 32 can include a dielectric material, such as silicon dioxide (SiO2).

Figure 10C:
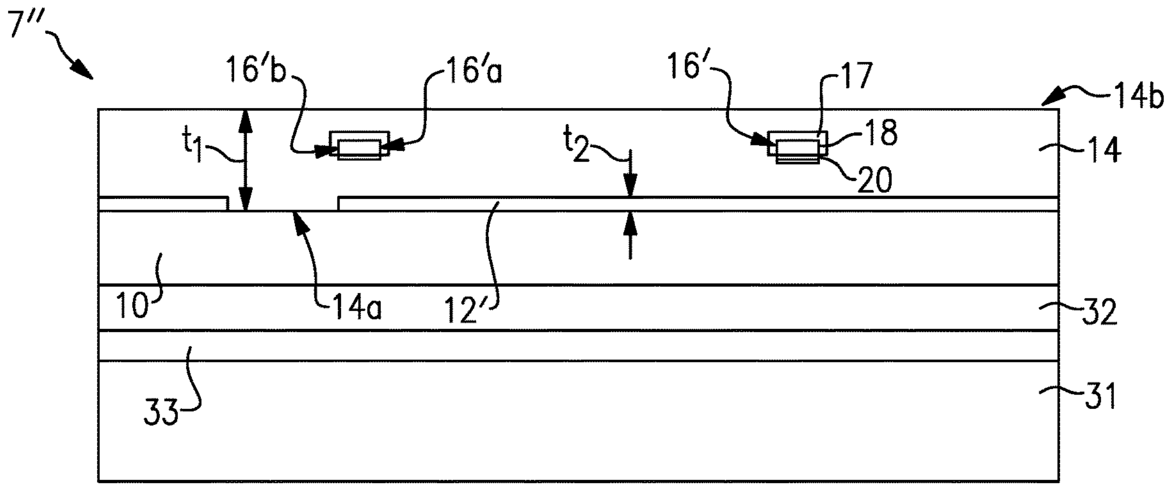
FIG. 10C illustrates a schematic cross-sectional side view of a SAW resonator having a multi-layer piezoelectric substrate according to another embodiment.

FIG. 10C illustrates a schematic cross-sectional side view of a SAW resonator 7" according to another embodiment. The SAW resonator 7" illustrated in FIG. 10C is generally similar to the resonator 7' illustrated in FIG. 10B. However, a multi-layer piezoelectric substrate of the SAW resonator 7" further includes a trap rich layer 33 between a functional layer 32 and the support substrate 31. The tap rich layer can include, for example, polycrystalline silicon, amorphous silicon, porous silicon, or silicon nitride. The trap rich layer can have a multilayer trap rich structure. In some embodiments, the tap rich layer may be a region at or near an interface between the support substrate 31 and the functional layer 32, and may not form a distinctive layer distinctive of the support substrate 2310 and/or the functional layer 32.

The mass loading strips disclosed herein can be implemented together with a piston mode structure of an IDT electrode and/or with an overlying layer arranged to adjust acoustic velocity in an underlying region of an acoustic wave device.

Figures 11A, 11B:
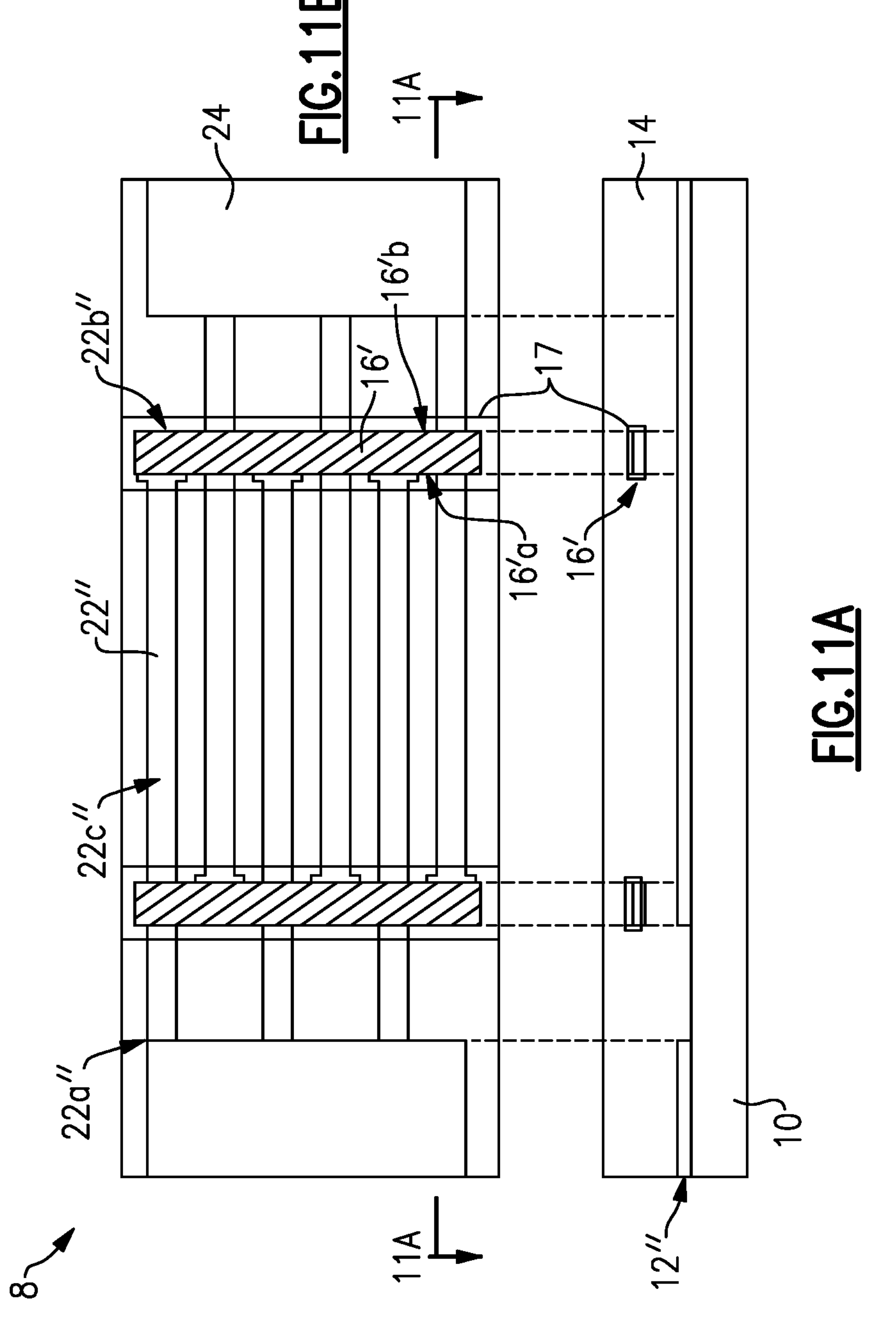
FIG. 11A illustrates a schematic cross-sectional side view of a SAW resonator according to another embodiment.
FIG. 11B illustrates a top view of the SAW resonator of FIG. 11A.

FIG. 11A illustrates a schematic cross-sectional side view of a surface acoustic wave (SAW) resonator 8 according to an embodiment. The SAW resonator 8 includes a piezoelectric layer 10, an IDT electrode 12" formed with (e.g., disposed over) the piezoelectric layer 10, a temperature compensation layer 14 over the IDT electrode 12", and a metal strip 16' buried in the temperature compensation layer 14.

FIG. 11B illustrates a top plan view of the SAW resonator 8 of FIG. 11A. Each finger 22" has a proximate end 22*a*" that is in contact with a bus bar 24 and a distal end 22*b*" opposite the proximate end 22*a*". A body portion 22*c*" of the finger 22" extends between the proximate end 22*a*" and the distal end 22*b*". A portion near the distal end 22*b*" can be referred as an edge portion. In the SAW resonator 8, the distal ends 22*b*" of the fingers of the IDT electrode 12" have a hammer head shape. The hammer head distal end 22*b*' can provide a velocity difference between the border region and a central part of the active region, thereby facilitating the piston mode operation.

Figures 12A, 12B:
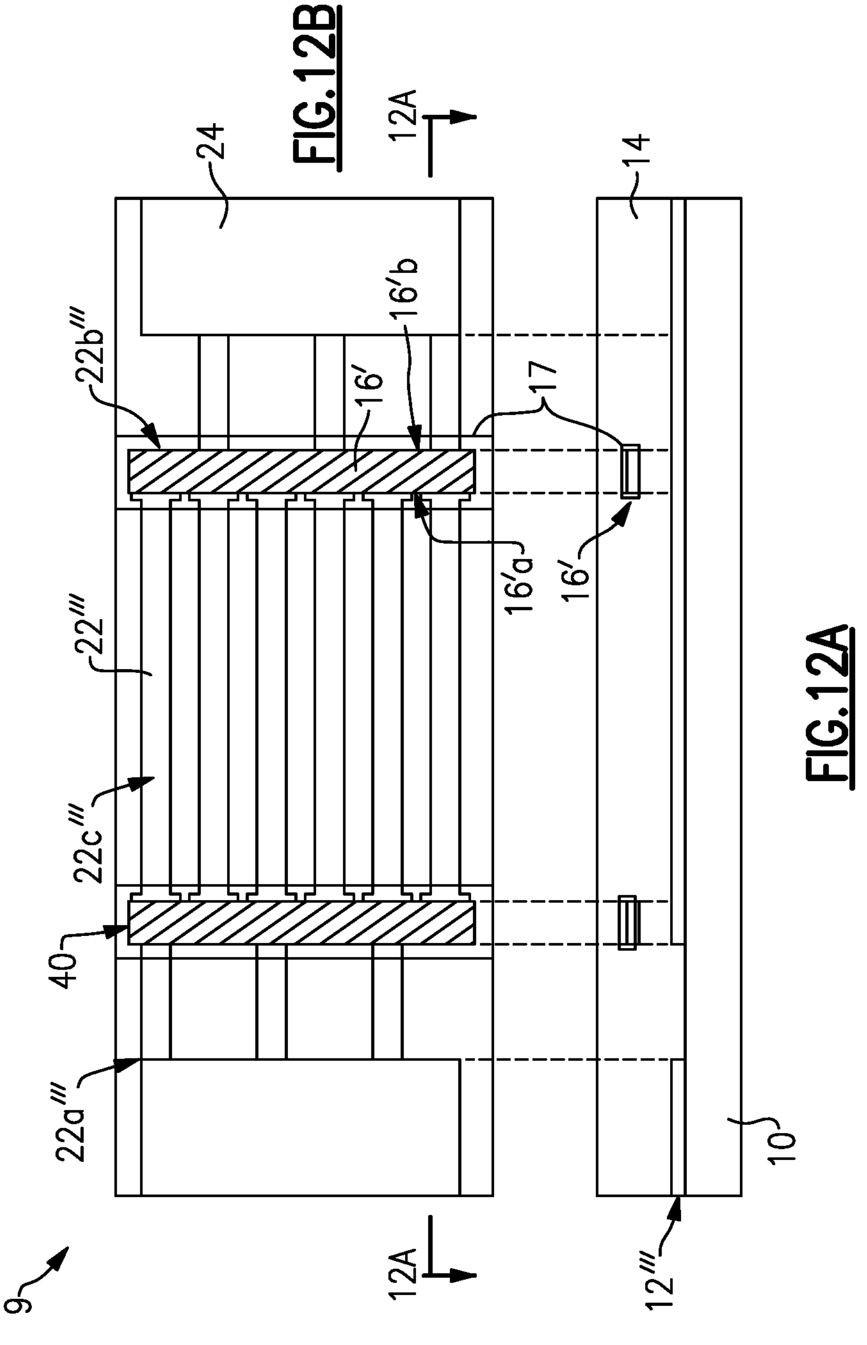
FIG. 12A illustrates a schematic cross-sectional side view of a SAW resonator according to another embodiment.
FIG. 12B illustrates a top view of the SAW resonator of FIG. 12A.

FIG. 12A illustrates a schematic cross-sectional side view of a surface acoustic wave (SAW) resonator 9 according to an embodiment. The SAW resonator 9 includes a piezoelectric layer 10, an IDT electrode 12'" formed with (e.g., disposed over) the piezoelectric layer 10, a temperature compensation layer 14 over the IDT electrode 12'", and a metal strip 16' buried in the temperature compensation layer 14.

FIG. 12B illustrates a top plan view of the SAW resonator 9 of FIG. 12A. Each finger 22" has a proximate end 22*a*'" that is in contact with a bus bar 24 and a distal end 22*b*'" opposite the proximate end 22*a*'. A body portion 22*c*'" of the finger 22'" extends between the proximate end 22*a*'" and the distal end 22*b*'". A portion near the distal end 22*b*'" can be referred as an edge portion. The SAW resonator 9 is generally similar to the SAW resonator 8 illustrated in FIGS. 11A and 11B, except that the body portion 22*c*'" of fingers of the IDT electrode 12'" of the SAW resonator 9 has a widened portion 40. The widened portion 40 can provide a velocity difference between the border region and a central part of the active region, thereby facilitating the piston mode operation.

Figures 13A, 13B:
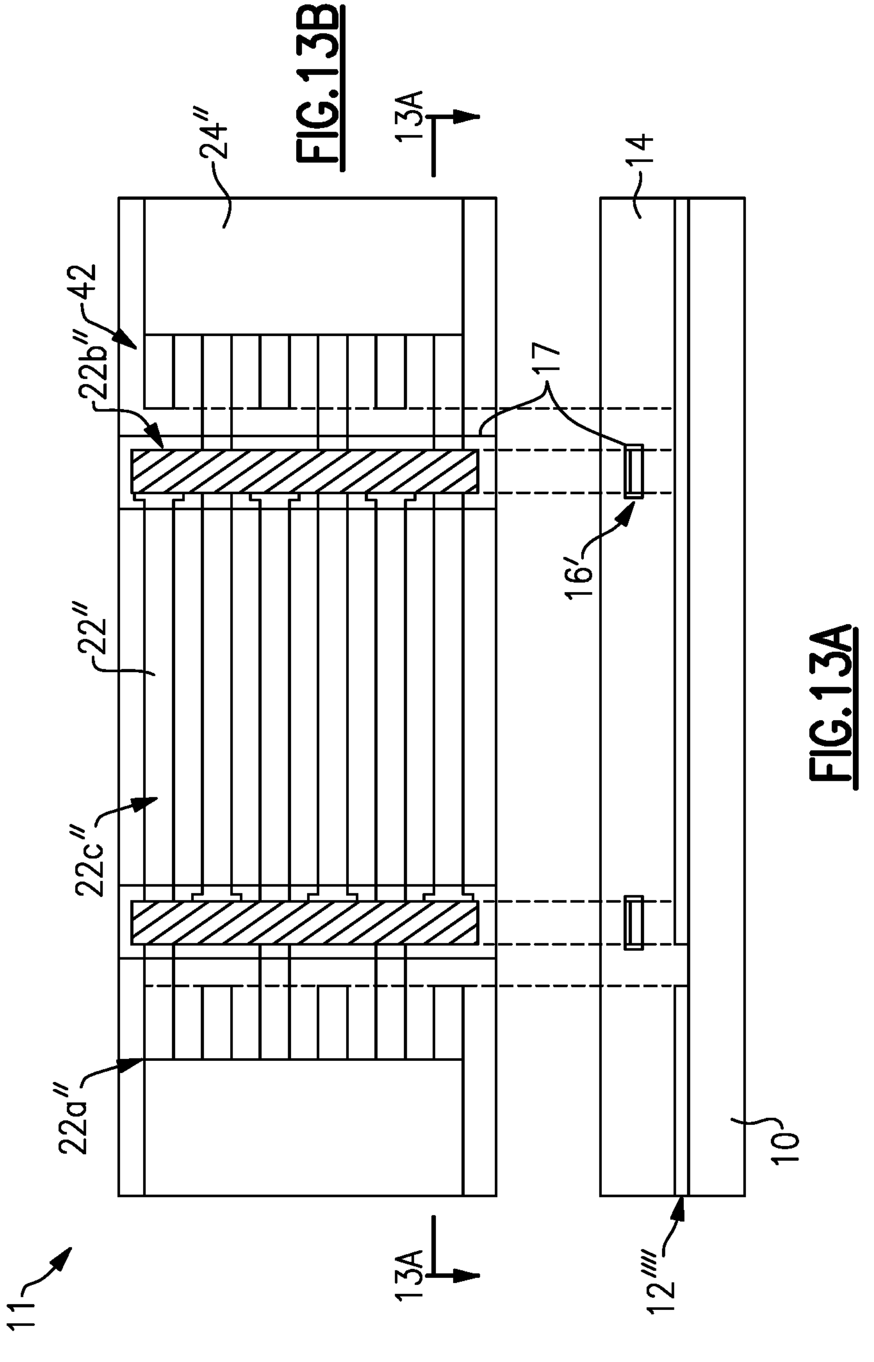
FIG. 13A illustrates a schematic cross-sectional side view of a SAW resonator according to another embodiment.
FIG. 13B illustrates a top view of the SAW resonator of FIG. 13A.

FIG. 13A illustrates a schematic cross-sectional side view of a surface acoustic wave (SAW) resonator 11 according to an embodiment. The SAW resonator 11 includes a piezoelectric layer 10, an IDT electrode 12"" formed with (e.g., disposed over) the piezoelectric layer 10, a temperature compensation layer 14 over the IDT electrode 12" ", and a metal strip 16' buried in the temperature compensation layer 14.

FIG. 13B illustrates a top plan view of the SAW resonator 11 of FIG. 13A. The SAW resonator 11 is generally similar to the SAW resonator 8 illustrated in FIGS. 11A and 11B, except that the bus bar 24" of the IDT electrode 12"" of the SAW resonator 11 includes an extension portion 42. The extension portion 42 can provide a velocity difference between the border region and a central part of the active region, thereby facilitating the piston mode operation. The extension portion 42 can be referred to as a dummy finger portion.

Figures 14A, 14B:
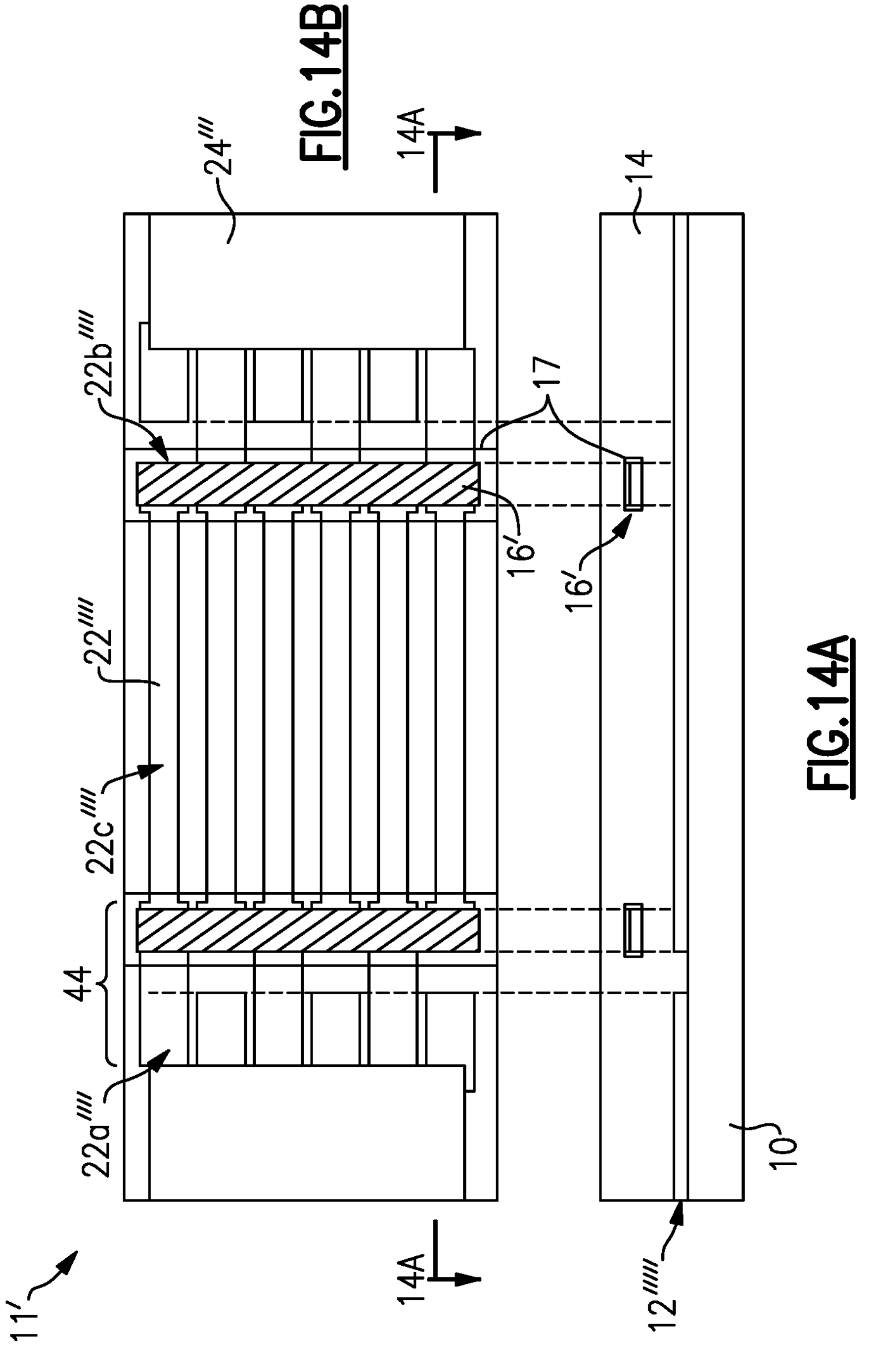
FIG. 14A illustrates a schematic cross-sectional side view of a SAW resonator according to another embodiment.
FIG. 14B illustrates a top view of the SAW resonator of FIG. 14A.

FIG. 14A illustrates a schematic cross-sectional side view of a surface acoustic wave (SAW) resonator 11' according to an embodiment. The SAW resonator 11' includes a piezoelectric layer 10, an IDT electrode 12' formed with (e.g., disposed over) the piezoelectric layer 10, a temperature compensation layer 14 over the IDT electrode 12""", and a metal strip 16' buried in the temperature compensation layer 14.

FIG. 14B illustrates a top plan view of the SAW resonator 11' of FIG. 14A. The SAW resonator 11' is generally similar to the SAW resonator 11 illustrated in FIGS. 13A and 13B, except that the IDT electrode 12' of the SAW resonator 11' includes a widened portion 44. The widened portion 44 can provide a velocity difference between the border region and a central part of the active region, thereby facilitating the piston mode operation.

Figures 15A, 15B:
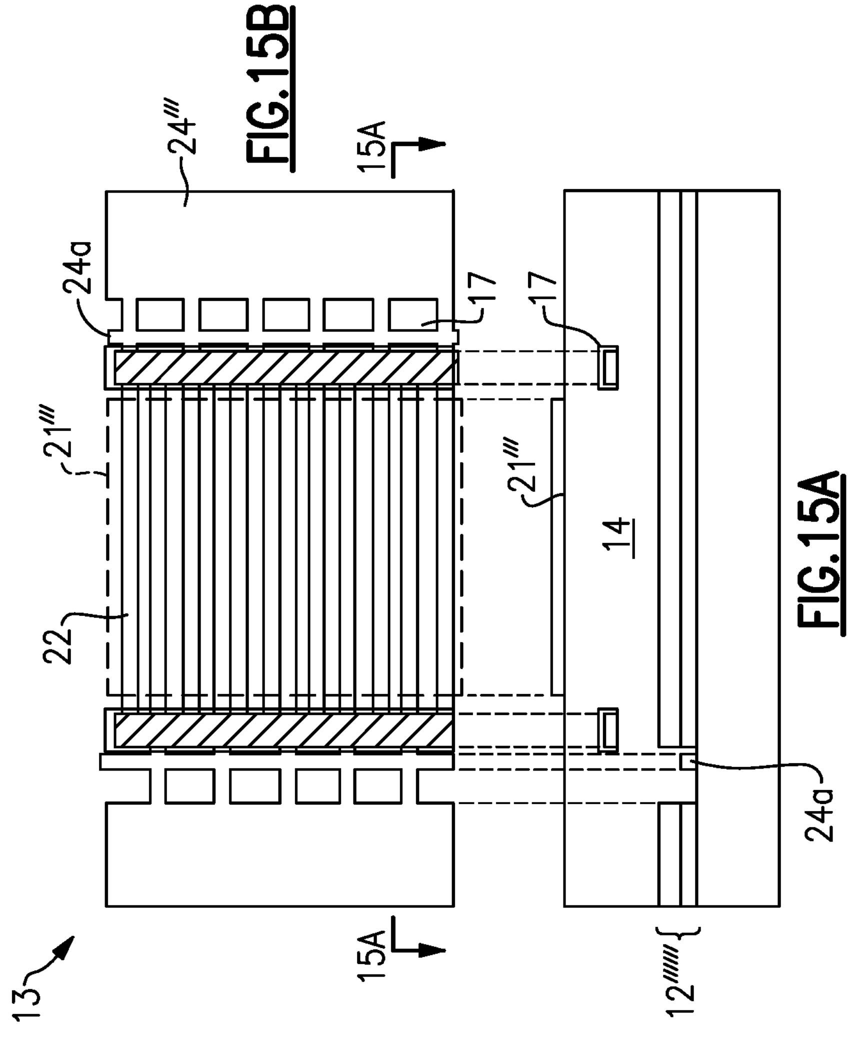
FIG. 15A illustrates a schematic cross-sectional side view of a SAW resonator according to another embodiment.
FIG. 15B illustrates a top view of the SAW resonator of FIG. 15A.

FIG. 15A illustrates a schematic cross-sectional side view of a surface acoustic wave (SAW) resonator 13 according to an embodiment. The SAW resonator 13 includes a piezoelectric layer 10, an IDT electrode 12" "" formed with (e.g., disposed over) the piezoelectric layer 10, a temperature compensation layer 14 over the IDT electrode 12' ", and a metal strip 16 buried in the temperature compensation layer 14.

FIG. 15B illustrates a top plan view of the SAW resonator 13 of FIG. 15A. A bus bar 24' of the IDT electrode 12'"" includes a mini bus bar portion 24*a*. The mini bus bar portion 24*a* can provide a velocity difference between the border region and a central part of the active region, thereby facilitating the piston mode operation.

Figure 16A:
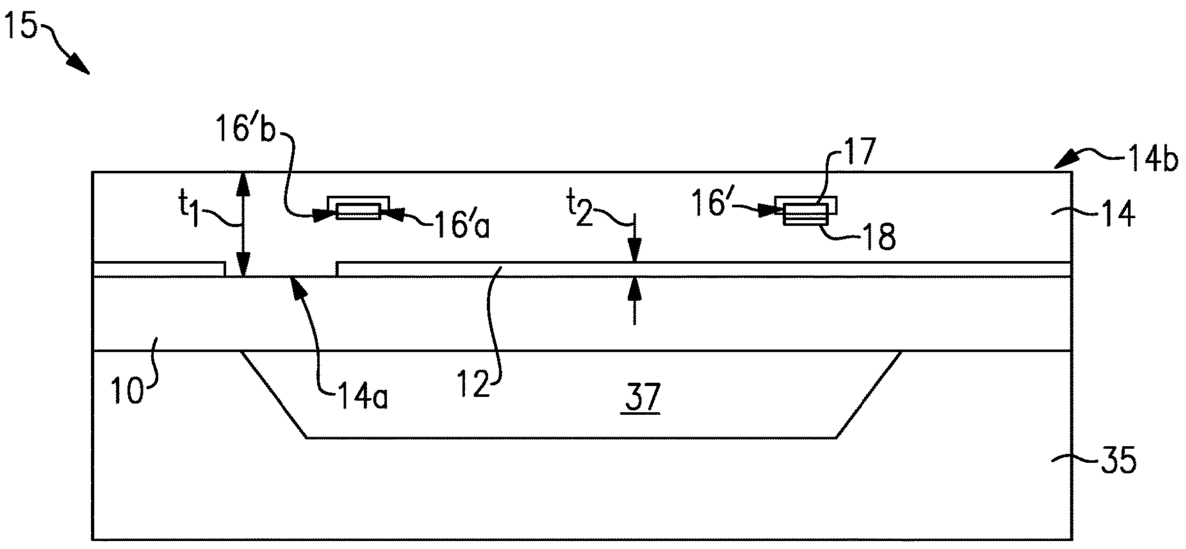
FIG. 16A illustrates a schematic cross-sectional side view of a Lamb wave device according to an embodiment.

FIG. 16A illustrates a schematic cross-sectional side view of a Lamb wave device 15 according to an embodiment. The Lamb wave device 15 can be a Lamb wave resonator. The Lamb wave device 15 includes a piezoelectric layer 10, an IDT electrode 12 formed with (e.g., disposed over) the piezoelectric layer 10, a temperature compensation layer 14 over the IDT electrode 12, and a metal strip 16' buried in the temperature compensation layer 14. The metal strip 16' performs a mass loading function. Accordingly, the metal strip 16' is an example of a mass loading strip. The Lamb wave device 15 also includes a substrate 35, and an air cavity 37 formed between the piezoelectric layer 10 and the substrate 35. The substrate 35 can include any suitable material. For example, the substrate 35 can be a semiconductor substrate, such as a silicon substrate.

Figure 16B:
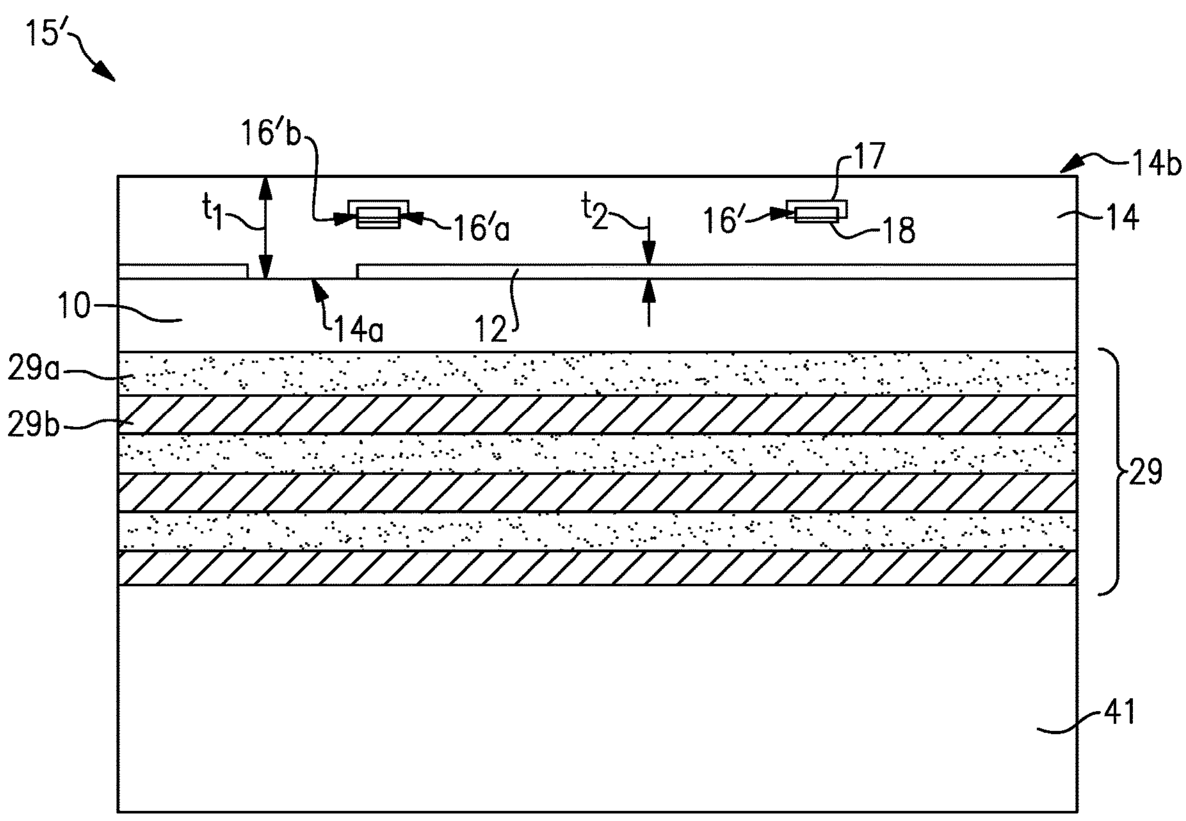
FIG. 16B illustrates a schematic cross-sectional side view of a Lamb wave device according to another embodiment.

FIG. 16B illustrates a schematic cross-sectional side view of a Lamb wave device 15' according to another embodiment. The Lamb wave device 15' can be a Lamb wave resonator. The Lamb wave device 15' is like the Lamb wave device 15 of FIG. 13A except that the Lamb wave device 15' includes a solid acoustic mirror 29 and a substrate 41 in place of the substrate 35 and the cavity 37. The solid acoustic mirror 29 can include Bragg reflectors. For instance, the solid acoustic mirror 29 can include alternating layers of a low impedance layer 29*a* and a high impedance layer 29*b*. As one example, the low impedance layer can be a silicon dioxide layer and the high impedance layer can be a tungsten layer. The substrate 41 can include any suitable material. For example, the substrate 41 can be a semiconductor substrate, such as a silicon substrate.

Figures 17A, 17B:
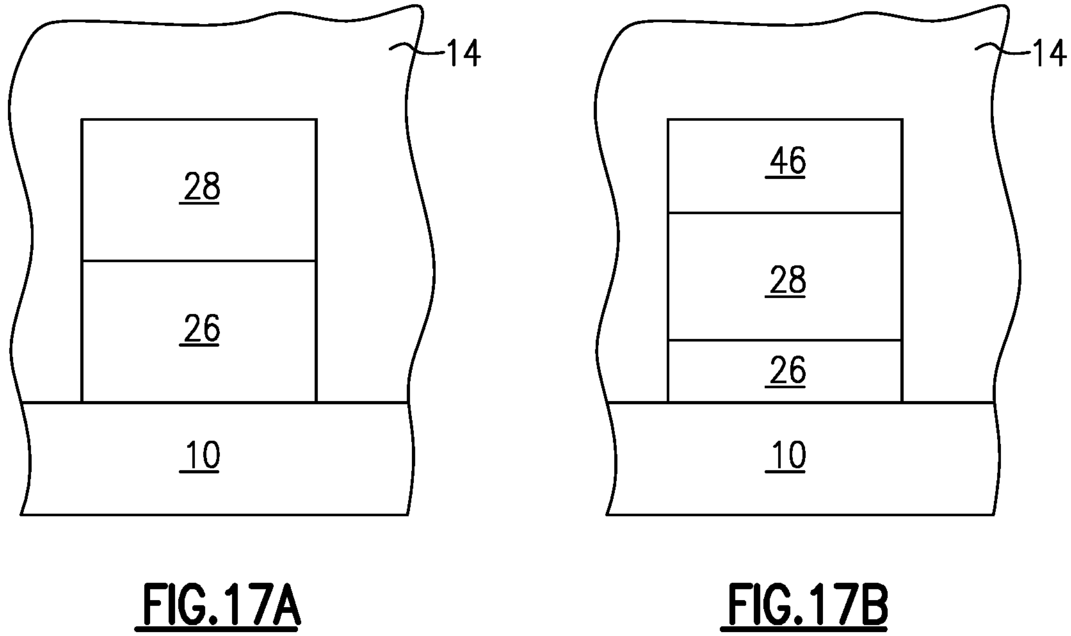
FIG. 17A illustrates a schematic cross-sectional side view of a portion of a surface acoustic wave (SAW) device.
FIG. 17B illustrates a schematic cross-sectional side view of a portion of another surface acoustic wave (SAW) device.

FIG. 17A illustrates a schematic cross-sectional side view of a portion of a surface acoustic wave (SAW) device. The portion of the SAW device includes a piezoelectric layer 10, a multi-layer interdigital transducer (IDT) electrode that has a first layer 26 and a second layer 28 on the piezoelectric layer 10, and a temperature compensation layer 14 over the piezoelectric layer 10.

For example, the first layer 26 can be tungsten (W) and the second layer 28 can be aluminum (Al) in certain embodiments. As another example, the first layer 26 can be aluminum (Al) and the second layer 28 can be tungsten (W), in certain embodiments. The first layer 26 may include one or more other metals, such as copper (Cu), Magnesium (Mg), titanium (Ti), molybdenum (Mo), etc. The first layer 26 may include alloys, such as AlMgCu, AlCu, etc. The second layer 28 may include one or more other metals, such as copper (Cu), Magnesium (Mg), titanium (Ti), molybdenum (Mo), etc. The second layer 28 may include alloys, such as AlMgCu, AlCu, etc.

The first layer 26 can impact acoustic properties of the SAW resonator and the second layer 28 can impact electrical properties of the SAW resonator, in some embodiments. For example, when the first layer 26 is an aluminum (Al) layer and the second layer 28 is a tungsten (W) layer, the Al layer can impact acoustic properties of the SAW resonator and the W layer can impact electrical properties of the SAW resonator. In some other embodiments, the second layer 28 can impact acoustic properties of the SAW resonator and the first layer 26 can impact electrical properties of the SAW resonator. For example, when the first layer 26 is a W layer and the second layer 28 is an Al layer, the Al layer can impact acoustic properties of the SAW resonator and the W layer can impact electrical properties of the SAW resonator.

FIG. 17B illustrates a schematic cross-sectional side view of a portion of a surface acoustic wave (SAW) device. The portion of the SAW device includes a piezoelectric layer 10, a multi-layer interdigital transducer (IDT) electrode that has a first layer 26, a second layer 28, and a third layer 46 on the piezoelectric layer 10, and a temperature compensation layer 14 over the piezoelectric layer 10. FIG. 17B is generally similar to FIG. 17A except that the IDT electrode illustrated in FIG. 17B includes the third layer 46.

The third layer 46 may include one or more of tungsten (W), aluminum (Al), copper (Cu), Magnesium (Mg), titanium (Ti), molybdenum (Mo), etc. The first layer 26 may include alloys, such as AlMgCu, AlCu, etc. For example, the first layer 26 can be titanium (Ti), the second layer 28 can be tungsten (W), and the third layer can be aluminum (Al) in certain embodiments. In some embodiments, the third layer 46 can impact acoustic properties of the SAW resonator. In some other embodiments, the third layer 46 can impact electrical properties of the SAW resonator. When titanium (Ti) is used as the first layer 26, the Ti layer can provide desirable crystal orientation for an overlying layer (the second layer 28 and/or the third layer 46.

A method of manufacturing an acoustic wave resonator according to an embodiment will now be described. The method can include providing an acoustic wave resonator structure with a temperature compensation layer over an interdigital transducer electrode. For example, the interdigital transducer electrode can be positioned on a piezoelectric layer. The interdigital transducer electrode includes fingers extending from a bus bar. The fingers each include an edge portion and a body portion. The method includes forming a conductive strip that overlaps with the edge portions of the fingers of the interdigital transducer electrode. The conductive strip includes a layer having a density at least as high as a density of a material of the interdigital transducer electrode that is in contact with the piezoelectric layer. A portion of the temperature compensation layer is positioned between the conductive strip and the interdigital transducer electrode. Forming the conductive strip may include depositing a second layer of the conductive strip over the piezoelectric layer such that the second layer is positioned between the piezoelectric layer and the layer of the conductive strip.

A method of filtering a radio frequency signal according to an embodiment will now be described. The method includes receiving a radio frequency signal at an input port of an acoustic wave filter that includes an acoustic wave resonator. The acoustic wave resonator includes a piezoelectric layer, an interdigital transducer electrode on the piezoelectric layer, and a conductive strip that overlaps edge portions of fingers of the interdigital transducer electrode. The conductive strip includes a layer having a density that is at least as high as a density of a material of the interdigital transducer electrode that is in contact with the piezoelectric layer. The method also includes filtering the radio frequency signal with the acoustic wave filter. The filtering includes suppressing a transverse mode using the conductive strip of the acoustic wave resonator. The filtering can be performed, for example, with the transmit filter 45 of FIG. 18A or the receive filter 50 of FIG. 18B.

A SAW device including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more SAW devices disclosed herein. FR1 can be from 410 MHz to 7.125 GHz, for example, as specified in a current 5G NR specification. One or more SAW devices in accordance with any suitable principles and advantages disclosed herein can be included in a filter arranged to filter a radio frequency signal in a 4G LTE operating band and/or in a filter having a passband that includes a 4G LTE operating band and a 5G NR operating band.

Figures 18A, 18B:
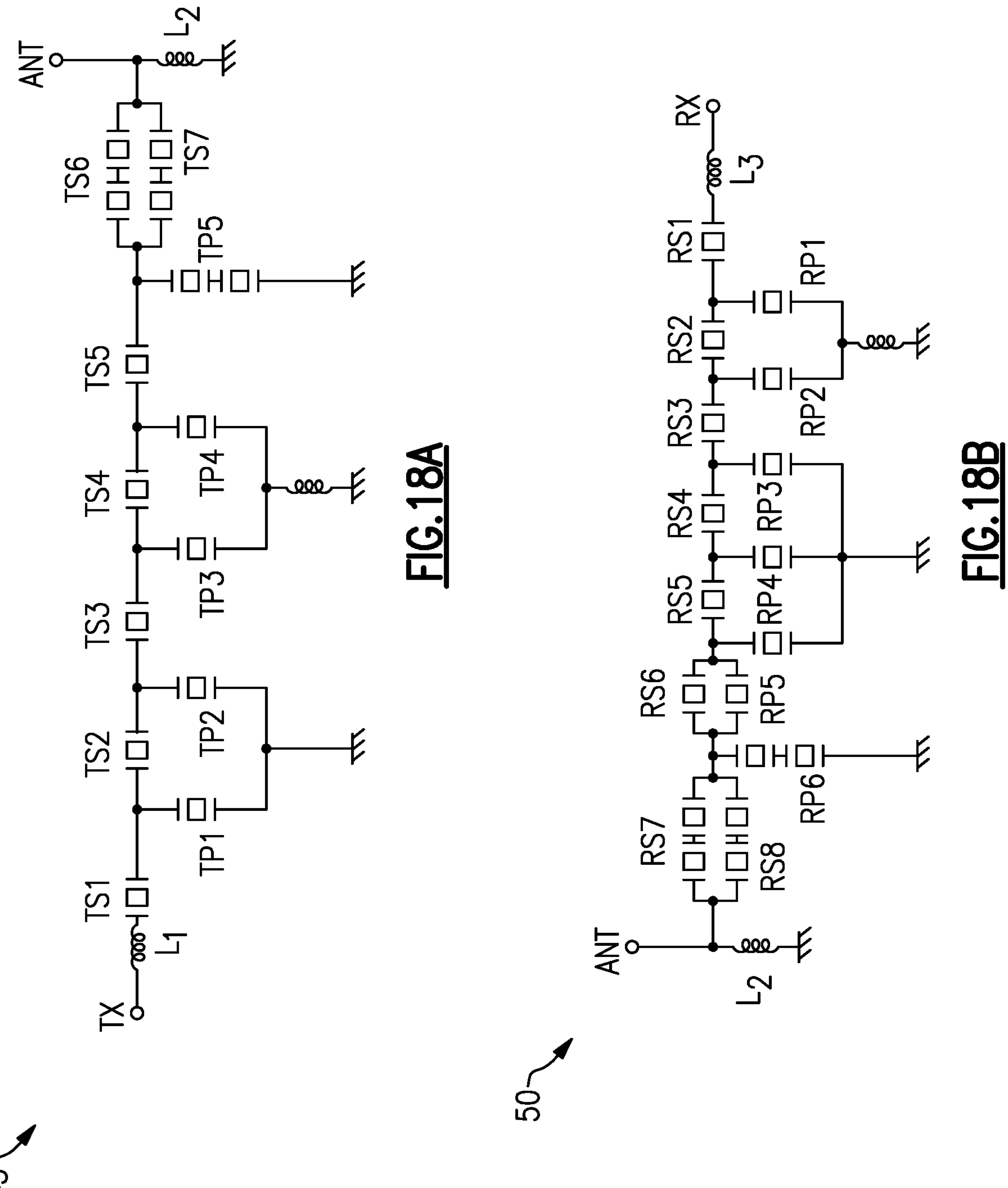
FIG. 18A is a schematic diagram of a transmit filter that includes a surface acoustic wave resonator according to an embodiment.
FIG. 18B is a schematic diagram of a receive filter that includes a surface acoustic wave resonator according to an embodiment.

FIG. 18A is a schematic diagram of an example transmit filter 45 that includes surface acoustic wave resonators of a surface acoustic wave component according to an embodiment. The transmit filter 45 can be a band pass filter. The illustrated transmit filter 45 is arranged to filter a radio frequency signal received at a transmit port TX and provide a filtered output signal to an antenna port ANT. The transmit filter 45 includes series SAW resonators TS1, TS2, TS3, TS4, TS5, TS6, and TS7, shunt SAW resonators TP1, TP2, TP3, TP4, and TP5, series input inductor L1, and shunt inductor L2. Some or all of the SAW resonators TS1, TS2, TS3, TS4, TS5, TS6, and TS7 and/or TP1, TP2, TP3, TP4, and TP5 can be a SAW resonators with a conductive strip for transverse mode suppression in accordance with any suitable principles and advantages disclosed herein. For instance, one or more of the SAW resonators of the transmit filter 45 can be a surface acoustic wave resonator 1 of FIGS. 1A and 1B. Alternatively or additionally, one or more of the SAW resonators of the transmit filter 45 can be any surface acoustic wave resonator disclosed herein. Any suitable number of series SAW resonators and shunt SAW resonators can be included in a transmit filter 45.

FIG. 18B is a schematic diagram of a receive filter 50 that includes surface acoustic wave resonators of a surface acoustic wave component according to an embodiment. The receive filter 50 can be a band pass filter. The illustrated receive filter 50 is arranged to filter a radio frequency signal received at an antenna port ANT and provide a filtered output signal to a receive port RX. The receive filter 50 includes series SAW resonators RS1, RS2, RS3, RS4, RS5, RS6, RS7, and RS7, shunt SAW resonators RP1, RP2, RP3, RP4, and RPS, and RP6, shunt inductor L2, and series output inductor L3. Some or all of the SAW resonators RS1, RS2, RS3, RS4, RS5, RS6, RS7, and RS8 and/or RP1, RP2, RP3, RP4, RPS, and RP6 can be SAW resonators with a conductive strip for transverse mode suppression in accordance with any suitable principles and advantages disclosed herein. For instance, one or more of the SAW resonators of the receive filter 50 can be a surface acoustic wave resonator 1 of FIGS. 1A and 1B. Alternatively or additionally, one or more of the SAW resonators of the receive filter 50 can be any surface acoustic wave resonator disclosed herein. Any suitable number of series SAW resonators and shunt SAW resonators can be included in a receive filter 50.

Figure 19:
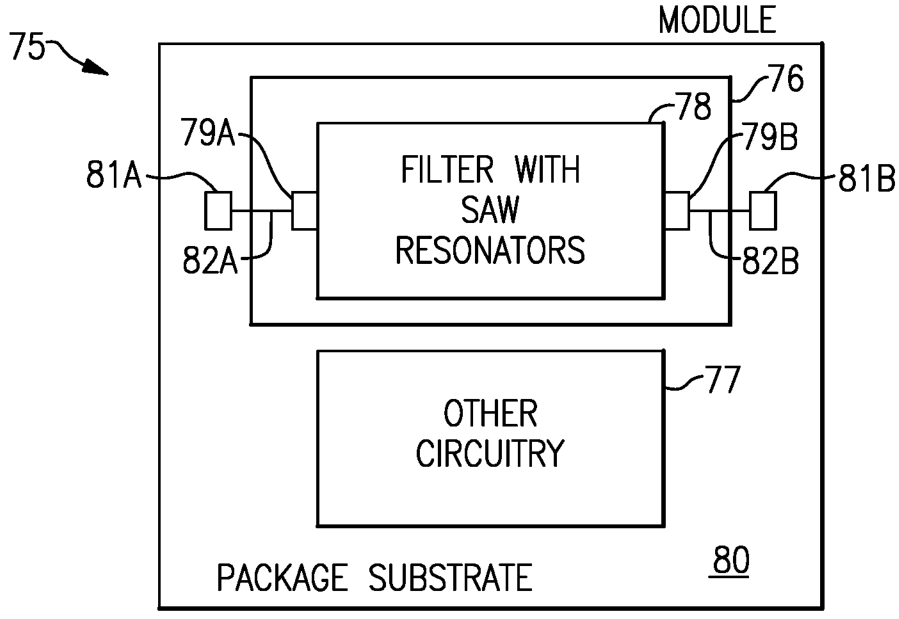
FIG. 19 is a schematic diagram of a radio frequency module that includes a surface acoustic wave component according to an embodiment.

FIG. 19 is a schematic diagram of a radio frequency module 75 that includes a surface acoustic wave component 76 according to an embodiment. The illustrated radio frequency module 75 includes the SAW component 76 and other circuitry 77. The SAW component 76 can include one or more SAW resonators with any suitable combination of features of the SAW resonators and/or acoustic wave devices disclosed herein. The SAW component 76 can include a SAW die that includes SAW resonators.

The SAW component 76 shown in FIG. 19 includes a filter 78 and terminals 79A and 79B. The filter 78 includes SAW resonators. One or more of the SAW resonators can be implemented in accordance with any suitable principles and advantages of the surface acoustic wave resonator 1 of FIGS. 1A and 1B and/or any surface acoustic wave resonator disclosed herein. The filter 78 can be a TC-SAW filter arranged as a band pass filter to filter radio frequency signals with frequencies below about 3.5 GHz in certain applications. The terminals 79A and 78B can serve, for example, as an input contact and an output contact. The SAW component 76 and the other circuitry 77 are on a common packaging substrate 80 in FIG. 19. The packaging substrate 80 can be a laminate substrate. The terminals 79A and 79B can be electrically connected to contacts 81A and 81B, respectively, on the packaging substrate 80 by way of electrical connectors 82A and 82B, respectively. The electrical connectors 82A and 82B can be bumps or wire bonds, for example. The other circuitry 77 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 75 can include one or more packaging structures to, for example, provide protection and/or facilitate easier handling of the radio frequency module 75. Such a packaging structure can include an overmold structure formed over the packaging substrate 80. The overmold structure can encapsulate some or all of the components of the radio frequency module 75.

Figure 20:
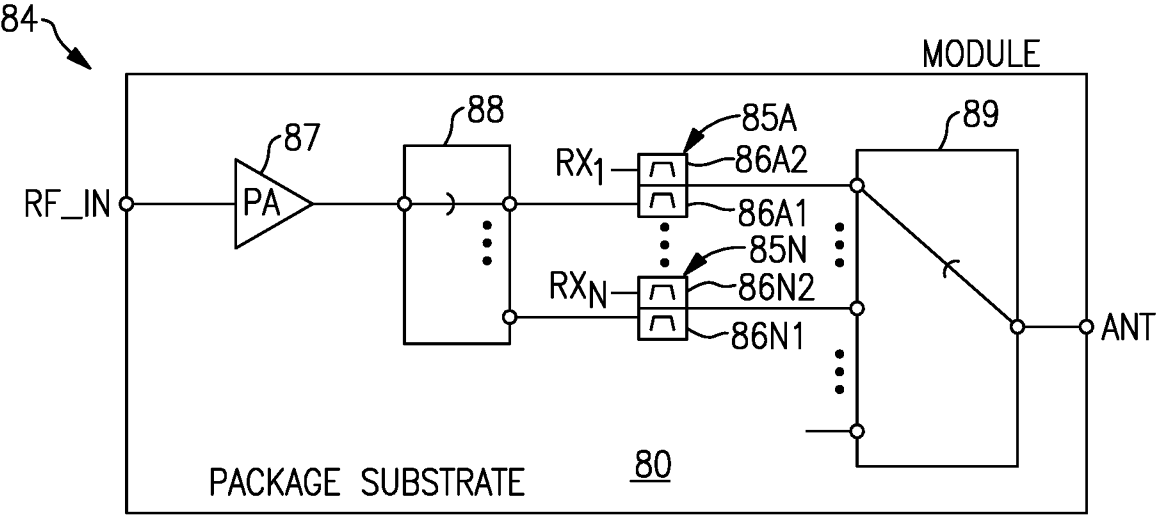
FIG. 20 is a schematic diagram of a radio frequency module that includes filters with surface acoustic wave resonators according to an embodiment.

FIG. 20 is a schematic diagram of a radio frequency module 84 that includes a surface acoustic wave component according to an embodiment. As illustrated, the radio frequency module 84 includes duplexers 85A to 85N that include respective transmit filters 86A1 to 86N1 and respective receive filters 86A2 to 86N2, a power amplifier 87, a select switch 88, and an antenna switch 89. The radio frequency module 84 can include a package that encloses the illustrated elements. The illustrated elements can be disposed on a common packaging substrate 80. The packaging substrate can be a laminate substrate, for example.

The duplexers 85A to 85N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 86A1 to 86N1 can include one or more SAW resonators in accordance with any suitable principles and advantages disclosed herein. Similarly, one or more of the receive filters 86A2 to 86N2 can include one or more SAW resonators in accordance with any suitable principles and advantages disclosed herein. Although FIG. 20 illustrates duplexers, any suitable principles and advantages disclosed herein can be implemented in other multiplexers (e.g., quadplexers, hexaplexers, octoplexers, etc.) and/or in switch-plexers.

The power amplifier 87 can amplify a radio frequency signal. The illustrated switch 88 is a multi-throw radio frequency switch. The switch 88 can electrically couple an output of the power amplifier 87 to a selected transmit filter of the transmit filters 86A1 to 86N1. In some instances, the switch 88 can electrically connect the output of the power amplifier 87 to more than one of the transmit filters 86A1 to 86N1. The antenna switch 89 can selectively couple a signal from one or more of the duplexers 85A to 85N to an antenna port ANT. The duplexers 85A to 85N can be associated with different frequency bands and/or different modes of operation (e.g., different power modes, different signaling modes, etc.).

Figure 21A:
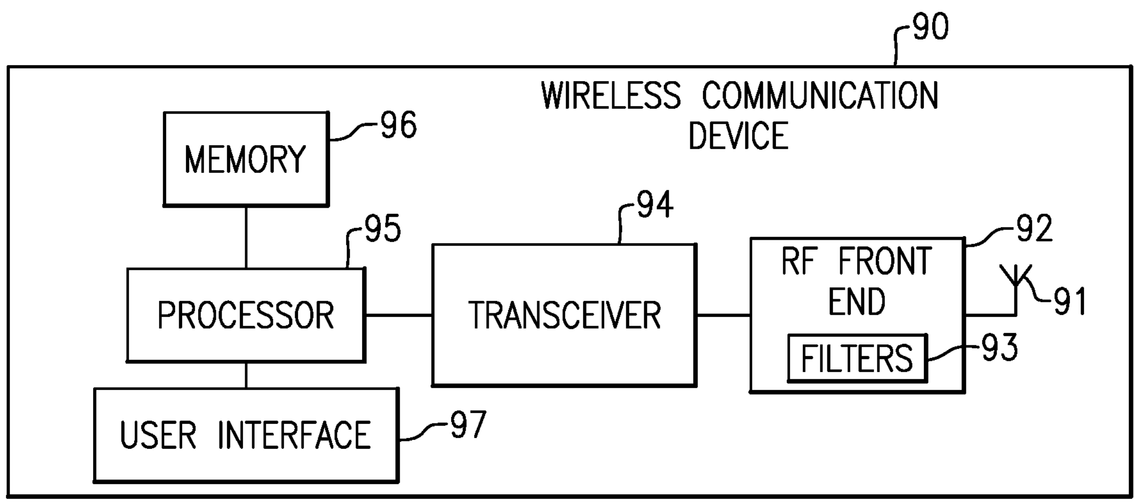
FIG. 21A is a schematic block diagram of a wireless communication device that includes a filter in accordance with one or more embodiments.

FIG. 21A is a schematic diagram of a wireless communication device 90 that includes filters 93 in a radio frequency front end 92 according to an embodiment. The filters 93 can include one or more SAW resonators in accordance with any suitable principles and advantages discussed herein. The wireless communication device 90 can be any suitable wireless communication device. For instance, a wireless communication device 90 can be a mobile phone, such as a smart phone. As illustrated, the wireless communication device 90 includes an antenna 91, an RF front end 92, a transceiver 94, a processor 95, a memory 96, and a user interface 97. The antenna 91 can transmit RF signals provided by the RF front end 92. Such RF signals can include carrier aggregation signals. Although not illustrated, the wireless communication device 90 can include a microphone and a speaker in certain applications.

The RF front end 92 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 92 can transmit and receive RF signals associated with any suitable communication standards. The filters 93 can include SAW resonators of a SAW component that includes any suitable combination of features discussed with reference to any embodiments discussed above.

The transceiver 94 can provide RF signals to the RF front end 92 for amplification and/or other processing. The transceiver 94 can also process an RF signal provided by a low noise amplifier of the RF front end 92. The transceiver 94 is in communication with the processor 95. The processor 95 can be a baseband processor. The processor 95 can provide any suitable base band processing functions for the wireless communication device 90. The memory 96 can be accessed by the processor 95. The memory 96 can store any suitable data for the wireless communication device 90. The user interface 97 can be any suitable user interface, such as a display with touch screen capabilities.

Figure 21B:
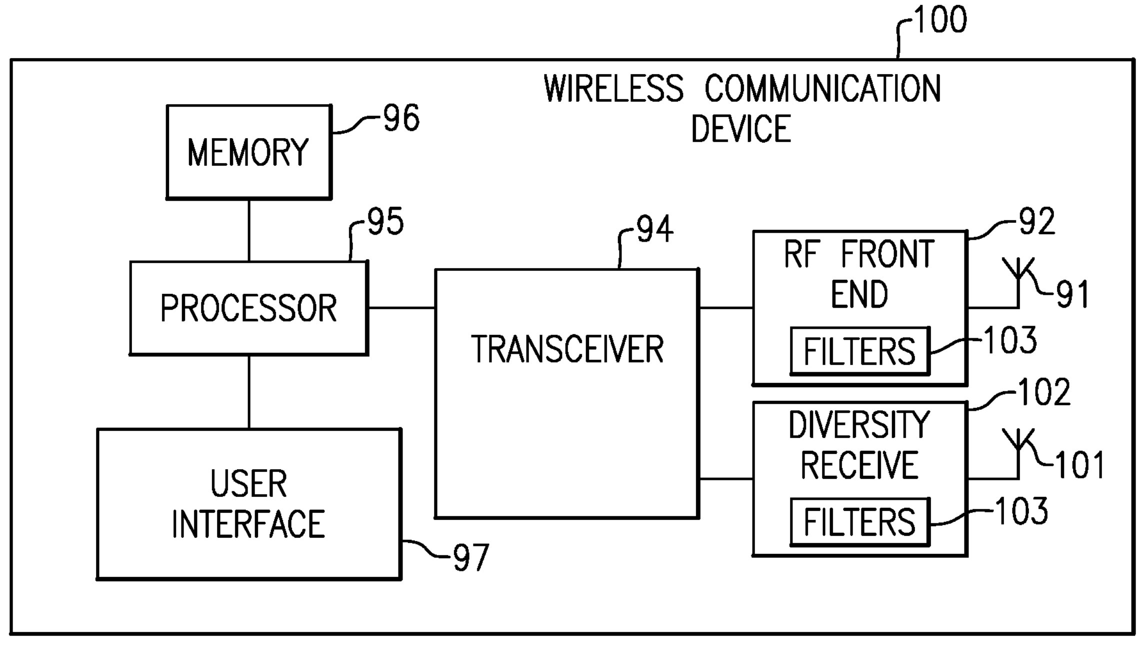
FIG. 21B is a schematic block diagram of another wireless communication device that includes a filter in accordance with one or more embodiments.

FIG. 21B is a schematic diagram of a wireless communication device 100 that includes filters 93 in a radio frequency front end 92 and a second filter 103 in a diversity receive module 102. The wireless communication device 100 is like the wireless communication device 90 of FIG. 21A, except that the wireless communication device 100 also includes diversity receive features. As illustrated in FIG. 21B, the wireless communication device 100 includes a diversity antenna 101, a diversity module 102 configured to process signals received by the diversity antenna 101 and including filters 103, and a transceiver 104 in communication with both the radio frequency front end 92 and the diversity receive module 102. The filters 103 can include one or more SAW resonators that include any suitable combination of features discussed with reference to any embodiments discussed above.

Although embodiments disclosed herein relate to surface acoustic wave resonators, any suitable principles and advantages disclosed herein can be applied to other types of acoustic wave resonators, such as Lamb wave resonators and/or boundary wave resonators. For example, any suitable combination of features of the conductive strips disclosed herein can be applied to a Lamb wave resonator and/or a boundary wave resonator.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 XHz to 300 GHz, such as in a frequency range from about 450 MHz to 8.5 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave device comprising:

a piezoelectric layer;

an interdigital transducer electrode formed with the piezoelectric layer, the interdigital transducer electrode including a bus bar and fingers extending from the bus bar, the fingers each including an edge portion and a body portion;

a temperature compensation layer over the interdigital transducer electrode;

a mass loading strip overlapping the edge portions of the fingers, a portion of the temperature compensation layer being positioned between the mass loading strip and the piezoelectric layer; and a buffer layer disposed at least partially between the mass loading strip and the temperature compensation layer, a thickness of the buffer layer being at least one forth a thickness of the mass loading strip.

2. The acoustic wave device of claim 1 wherein the mass loading strip includes a layer having a density that is at least as high as a most dense layer of a material of the interdigital transducer electrode.

3. The acoustic wave device of claim 2 wherein the mass loading strip consists of the layer.

4. The acoustic wave device of claim 2 wherein the mass loading strip includes a second layer.

5. The acoustic wave device of claim 1 wherein the mass loading strip is embedded in the temperature compensation layer.

6. The acoustic wave device of claim 1 wherein the temperature compensation layer is a silicon dioxide layer.

7. The acoustic wave device of claim 6 wherein the mass loading strip is a molybdenum layer.

8. The acoustic wave device of claim 7 wherein the buffer layer is a molybdenum silicide layer.

9. The acoustic wave device of claim 1 wherein the buffer layer has a coefficient of thermal expansion greater than a coefficient of thermal expansion of the temperature compensation layer and less than a coefficient of thermal expansion of the mass loading strip.

10. The acoustic wave device of claim 1 wherein the mass loading strip has a bottom side, an top side, and a sidewall extending between the bottom side and the top side, the buffer layer is disposed between the top side and the sidewall of the mass loading strip and the temperature compensation layer.

11. The acoustic wave device of claim 10 wherein the buffer layer is further disposed between the bottom side of the mass loading strip and the temperature compensation layer.

12. An acoustic wave device comprising:

a piezoelectric layer;

an interdigital transducer electrode formed with the piezoelectric layer, the interdigital transducer electrode including a bus bar and fingers extending from the bus bar, the fingers each including an edge portion and a body portion;

a temperature compensation layer over the interdigital transducer electrode;

a mass loading strip overlapping the edge portions of the fingers, a portion of the temperature compensation layer being positioned between the mass loading strip and the piezoelectric layer, the mass loading strip having a bottom side, an top side, and a sidewall extending between the bottom side and the top side; and a buffer layer disposed at least partially between the bottom side, the top side, and the side wall of the mass loading strip and the temperature compensation layer.

13. The acoustic wave device of claim 12 wherein the mass loading strip includes a layer having a density that is at least as high as a most dense layer of a material of the interdigital transducer electrode.

14. The acoustic wave device of claim 13 wherein the mass loading strip includes a second layer.

15. The acoustic wave device of claim 12 wherein the mass loading strip is embedded in the temperature compensation layer.

16. The acoustic wave device of claim 12 wherein the temperature compensation layer is a silicon dioxide layer.

17. The acoustic wave device of claim 16 wherein the mass loading strip is a molybdenum layer, and the buffer layer is a molybdenum silicide layer.

18. The acoustic wave device of claim 12 wherein the buffer layer has a coefficient of thermal expansion greater than a coefficient of thermal expansion of the temperature compensation layer and less than a coefficient of thermal expansion of the mass loading strip.

19. The acoustic wave device of claim 12 wherein the thickness of the buffer layer is at least one third the thickness of the mass loading strip.

20. The acoustic wave device of claim 12 further comprising a silicon nitride layer over the temperature compensation layer.

* * * * *